United States Patent
Prasad et al.

(10) Patent No.: US 10,471,698 B2
(45) Date of Patent: *Nov. 12, 2019

(54) COMPUTATIONAL MODEL AND THREE-DIMENSIONAL (3D) PRINTING METHODS

(71) Applicant: Hewlett-Packard Development Company, L.P., Houston, TX (US)

(72) Inventors: Keshava A. Prasad, San Marcos, CA (US); David H. Donovan, San Diego, CA (US); Krzysztof Nauka, Palo Alto, CA (US); Ali Emamjomeh, San Diego, CA (US); Hua Tan, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 281 days.

This patent is subject to a terminal disclaimer.

(21) Appl. No.: 15/127,739

(22) PCT Filed: Apr. 30, 2014

(86) PCT No.: PCT/US2014/036133
§ 371 (c)(1),
(2) Date: Sep. 20, 2016

(87) PCT Pub. No.: WO2015/167520
PCT Pub. Date: Nov. 5, 2015

(65) Prior Publication Data
US 2017/0151722 A1     Jun. 1, 2017

(51) Int. Cl.
*G06F 17/50* (2006.01)
*B33Y 50/02* (2015.01)
(Continued)

(52) U.S. Cl.
CPC ............ *B33Y 50/02* (2014.12); *B29C 64/165* (2017.08); *B29C 64/386* (2017.08); *B29C 64/40* (2017.08);
(Continued)

(58) Field of Classification Search
CPC ... B29C 64/165; B29C 64/386; B29C 64/393; B33Y 10/00; B33Y 50/00; B33Y 50/02;
(Continued)

(56) References Cited

U.S. PATENT DOCUMENTS 5,518,680 A * 5/1996 Cima .................... B29C 64/165
264/113 X
6,322,728 B1    11/2001 Brodkin et al.
(Continued)

FOREIGN PATENT DOCUMENTS

CN         1500608     6/2004
CN       100406169     9/2005
(Continued)

OTHER PUBLICATIONS

International Search Report and Written Opinion for International Application No. PCT/US2014/036133 dated Jan. 29, 2015, 11 pages.

*Primary Examiner* — Leo B Tentoni
(74) *Attorney, Agent, or Firm* — Dierker & Kavanaugh PC

(57) ABSTRACT

In a computational modeling method for identifying how to apply a modifying agent during a three-dimensional (3D) printing method, a thermal diffusion model of a layer of a 3D object to be formed from a portion of a sinterable material using the 3D printing method is created. The thermal diffusion model is created by a computer running computer readable instructions stored on a non-transitory, tangible computer readable storage medium. A quantity of the modifying agent to be selectively applied is calculated, by the computer, based upon the thermal diffusion model.

15 Claims, 8 Drawing Sheets

(51) Int. Cl.
  *B29C 67/00* (2017.01)
  *B33Y 10/00* (2015.01)
  *B29C 64/165* (2017.01)
  *B29C 64/386* (2017.01)
  *B29C 64/40* (2017.01)

(52) U.S. Cl.
  CPC .............. *B29C 67/00* (2013.01); *B33Y 10/00* (2014.12); *G06F 17/5009* (2013.01)

(58) Field of Classification Search
  CPC .. G05B 19/4099; G06F 17/50; G06F 17/5009
  USPC .............. 264/40.1, 40.6, 460, 461, 462, 463
  See application file for complete search history.

(56) References Cited

U.S. PATENT DOCUMENTS

| | | |
|---|---|---|
| 6,454,811 B1 | 9/2002 | Sherwood et al. |
| 6,589,471 B1 | 7/2003 | Khoshnevis |
| 7,879,282 B2 | 2/2011 | Hopkinson et al. |
| 2004/0018107 A1 | 1/2004 | Khoshnevis |
| 2005/0014005 A1* | 1/2005 | Kramer .................. B33Y 10/00 428/413 |
| 2005/0079086 A1 | 4/2005 | Farr et al. |
| 2005/0087903 A1* | 4/2005 | Farr ...................... B29C 64/165 264/113 |
| 2006/0244169 A1 | 11/2006 | Monsheimer et al. |
| 2007/0007698 A1 | 1/2007 | Sano |
| 2007/0241482 A1 | 10/2007 | Giller et al. |
| 2012/0163553 A1 | 6/2012 | Deych et al. |
| 2013/0171431 A1 | 7/2013 | Swartz et al. |
| 2014/0314613 A1* | 10/2014 | Hopkinson ........... B29C 64/165 264/460 X |

FOREIGN PATENT DOCUMENTS

| | | |
|---|---|---|
| EP | 1737646 | 1/2007 |
| EP | 2033779 | 3/2009 |
| JP | 2007529340 | 10/2007 |
| TW | 200513330 | 4/2005 |
| WO | WO-0021470 | 4/2000 |
| WO | WO-0138061 | 5/2001 |
| WO | WO2005090055 | 9/2005 |

* cited by examiner

COMPUTATIONAL MODEL AND THREE-DIMENSIONAL (3D) PRINTING METHODS

BACKGROUND

Three-dimensional (3D) printing is an additive printing process used to make three-dimensional solid objects from a digital model. 3D printing is often used in rapid product prototyping, mold generation, and mold master generation. 3D printing techniques are considered additive processes because they involve the application of successive layers of material. This is unlike traditional machining processes, which often rely upon the removal of material to create the final object. Materials used in 3D printing often require curing or fusing, which for some materials may be accomplished using heat-assisted extrusion or sintering, and for other materials may be accomplished using digital light projection technology.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Examples of the three-dimensional (3D) printing method disclosed herein utilize light area processing. During light area processing, an entire layer of a sinterable material is exposed to radiation, but only a selected region of the sinterable material is fused and hardened to become a layer of a 3D object. In the examples disclosed herein, a coalescent agent is selectively deposited in contact with the selected region of the sinterable material. In some instances, the coalescent agent(s) is capable of penetrating into the layer of the sinterable material. In other instances, the coalescent agent may remain on the surface of the sinterable material. This coalescent agent is capable of absorbing radiation and converting the absorbed radiation to thermal energy, which in turn melts or sinters the sinterable material that is in contact with the coalescent agent. This causes the sinterable material to sinter, fuse, bind, cure, etc. to form the layer of the 3D object. When the term curing is used, it may mean curing, sintering, fusing, binding, or the like.

In some instances, it has been found that the thermal energy may propagate into surrounding sinterable material. This may result in the subsequent solidification of area(s)/portion(s) of the sinterable material that were not intended to be solidified, and this effect is referred to herein as coalescence bleed. Coalescence bleed may result, for example, in a reduction in the overall dimensional accuracy of generated three-dimensional objects and/or part dimensional growth. For example, edge acuity may be undesirably rough, undefined, etc. The effects of coalescence bleed may be managed by delivering an example of the modifying agent disclosed herein to appropriate portion(s) of the sinterable material prior to radiation exposure. Examples of the modifying agent serve to reduce the degree of coalescence, or prevent coalescence of a portion of the sinterable material on which the modifying agent has been delivered or has penetrated. In the examples disclosed herein, how to apply the modifying agent (in terms of position and/or quantity) may also be determined prior to actually applying the modifying agent. This enables one to enhance the effects of the modifying agent, to produce more dimensionally accurate parts, to improve the surface finish of parts, and/or to potentially reduce or eliminate the need for post-processing techniques, which are otherwise used to address similar concerns.

Figure 1:
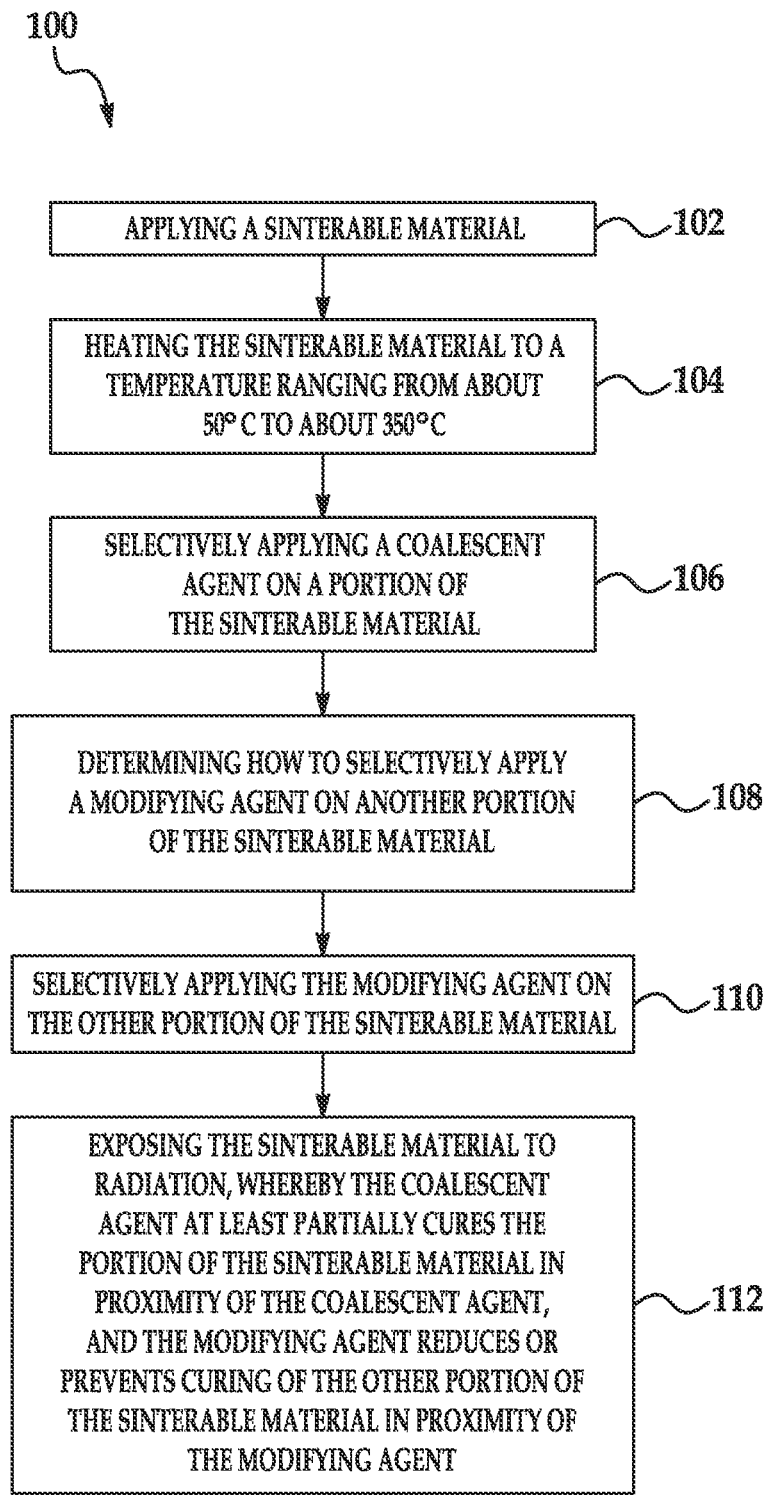
FIG. 1 is a flow diagram illustrating an example of a 3D printing method disclosed herein.

An example of the 3D printing method 100 is depicted in FIG. 1. It is to be understood that each of the steps of the method 100 shown in FIG. 1 will be discussed in detail herein, and in some instances, FIGS. 2A through 2F and FIGS. 3 and 4 will be discussed in conjunction with FIG. 1.

As shown at reference numeral 102, the method 100 includes applying a sinterable material. An example of this step 102 is shown in cross-section at FIG. 2A. In the example shown in FIG. 2A, one layer 10 of the sinterable material 16 has been deposited, as will be discussed in more detail below.

The sinterable material 16 may be a powder, a liquid, a paste, or a gel. Examples of sinterable material 16 include semi-crystalline thermoplastic materials with a wide processing window of greater than 5° C. (i.e., the temperature range between the melting point and the re-crystallization temperature). Some specific examples of the sinterable material 16 include polyamides (e.g., nylon 11, nylon 12, nylon 6, nylon 8, nylon 9, nylon 66, nylon 612, nylon 812, nylon 912, etc.). Other specific examples of the sinterable material 16 include polyethylene, polyethylene terephthalate (PET), and amorphous variation of these materials. Still other examples of suitable sinterable materials 16 include polystyrene, polyacetals, polypropylene, polycarbonate, and blends of any two or more of the polymers listed herein. Core shell polymer particles of these materials may also be used.

In an example, the sinterable material 16 includes similarly sized polymer particles (e.g., particles of all the same size). In another example, the sinterable material 16 includes differently sized polymer particles. For example, the sinterable material 16 may include particles having two or more different sizes. In the example shown in FIG. 2A, the sinterable material 16 includes a plurality of polymer particles 16A, 16B, 16C containing at least three different particle sizes. While polymer particles 16A, 16B, 16C of three different sizes are shown in FIG. 2A, it is to be understood that any additional number of particle sizes may be added.

Figure 2A:
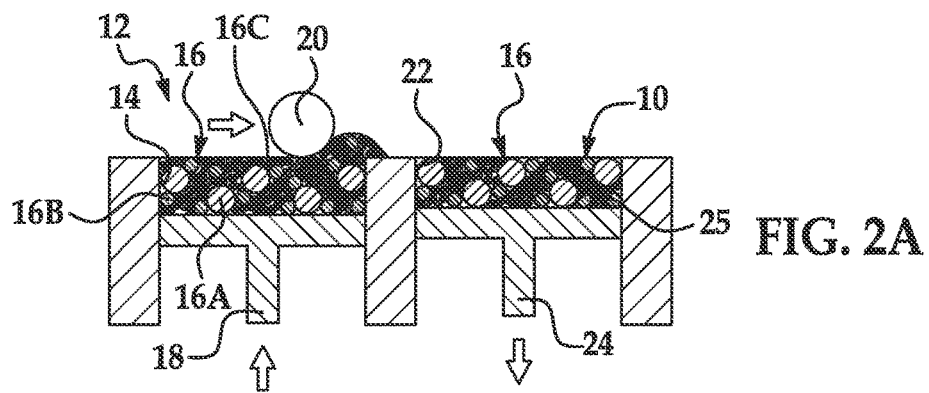
FIGS. 2A through 2F are cross-sectional views of the steps involved in forming layer(s) of a 3D object using an example of the 3D printing method disclosed herein.

In the example shown in FIG. 2A, the average size of the first polymer particle 16A is larger than the average size of the second polymer particle 16B, and the average size of the second polymer particle 16B is larger than the average size of the third polymer particle 16C. The term "size", as used herein, refers to the diameter of a spherical particle, or the average diameter of a non-spherical particle (i.e., the average of multiple diameters across the particle). In general, the average size of each of the first, second, and third particles 16A, 16B, 16C ranges from 5 µm to about 100 µm. As an example of the different sizes for each of the particles 16A, 16B, 16C, the average size of the first polymer particle 16A may be greater than 50 µm, the average size of the second polymer particle 16B may be between 10 µm and 30 µm, and the average size of the third polymer particle 16C may be equal to or less than 10 µm.

The shape of the particles 16A, 16B, 16C may also be the same or different. In an example, the particles 16A, 16B, 16C have spherical or near-spherical shapes. Particles 16A, 16B, 16C that have a sphericity of >0.84 are considered to be spherical or near-spherical in the examples disclosed herein. Thus, any particles 16A, 16B, 16C having a sphericity of <0.84 are non-spherical.

One or more of the particles 16A, 16B, 16C may also be physically modified, so that the surface topography of the particles 16A, 16B, 16C is altered, and/or chemically modified.

It is to be understood that sinterable material 16 may include, in addition to polymer particles 16A, 16B, and/or 16C, a charging agent, a flow aid, or combinations thereof.

Charging agent(s) may be added to suppress tribo-charging. Examples of suitable charging agent(s) include aliphatic amines (which may be ethoxylated), aliphatic amides, quaternary ammonium salts (e.g., behentrimonium chloride or cocamidopropyl betaine), esters of phosphoric acid, polyethylene glycol esters, or polyols. Some suitable commercially available charging agents include HOSTASTAT® FA 38 (natural based ethoxylated alkylamine), HOSTASTAT® FE2 (fatty acid ester), and HOSTASTAT® HS 1 (alkane sulfonate), each of which is available from Clariant Int. Ltd.). In an example, the charging agent is added in an amount ranging from greater than 0 wt % to less than 5 wt % based upon the total wt % of the polymer particles.

Flow aid(s) may be added to improve the coating flowability of the sinterable material 16. Flow aid(s) may be particularly desirable when the particles 16A, 16B, and/or 16C are less than 25 µm in size. The flow aid improves the flowability of the sinterable material 16 by reducing the friction, the lateral drag, and the tribocharge buildup (by increasing the particle conductivity). Examples of suitable flow aids include tricalcium phosphate (E341), powdered cellulose (E460(ii)), magnesium stearate (E470b), sodium bicarbonate (E500), sodium ferrocyanide (E535), potassium ferrocyanide (E536), calcium ferrocyanide (E538), bone phosphate (E542), sodium silicate (E550), silicon dioxide (E551), calcium silicate (E552), magnesium trisilicate (E553a), talcum powder (E553b), sodium aluminosilicate (E554), potassium aluminium silicate (E555), calcium aluminosilicate (E556), bentonite (E558), aluminium silicate (E559), stearic acid (E570), or polydimethylsiloxane (E900). In an example, the flow aid is added in an amount ranging from greater than 0 wt % to less than 5 wt % based upon the total wt % of the particles 16A, 16B, and/or 16C.

In the example shown in FIG. 2A, a printing system 12 for forming the 3D object includes a supply bed 14 (including a supply of the sinterable material 16), a delivery piston 18, a roller 20, a fabrication bed 22 (having a contact surface 25), and a fabrication piston 24. Each of these physical elements may be operatively connected to a central processing unit (not shown) of the printing system 12. The central processing unit (e.g., running computer readable instructions stored on a non-transitory, tangible computer readable storage medium) manipulates and transforms data represented as physical (electronic) quantities within the printer's registers and memories in order to control the physical elements to create the 3D object. The data for the selective delivery of the sinterable material 16, the coalescent agent, etc. may be derived from a model of the 3D object to be formed.

The delivery piston 18 and the fabrication piston 24 may be the same type of piston, but are programmed to move in opposite directions. In an example, when a first layer of the 3D object is to be formed, the delivery piston 18 may be programmed to push a predetermined amount of the sinterable material 16 out of the opening in the supply bed 14 and the fabrication piston 24 may be programmed to move in the opposite direction of the delivery piston 18 in order to increase the depth of the fabrication bed 22. The delivery piston 18 will advance enough so that when the roller 20 pushes the sinterable material 16 into the fabrication bed 22 and onto the contact surface 25, the depth of the fabrication bed 22 is sufficient so that a layer 10 of the sinterable material 16 may be formed in the bed 22. The roller 20 is capable of spreading the sinterable material 16 into the fabrication bed 22 to form the layer 10, which is relatively uniform in thickness. In an example, the thickness of the layer 10 ranges from about 90 µm to about 110 µm, although thinner or thicker layers may also be used.

It is to be understood that the roller 20 may be replaced by other tools, such as a blade that may be desirable for spreading different types of powders, or a combination of a roller and a blade.

Figure 2B:
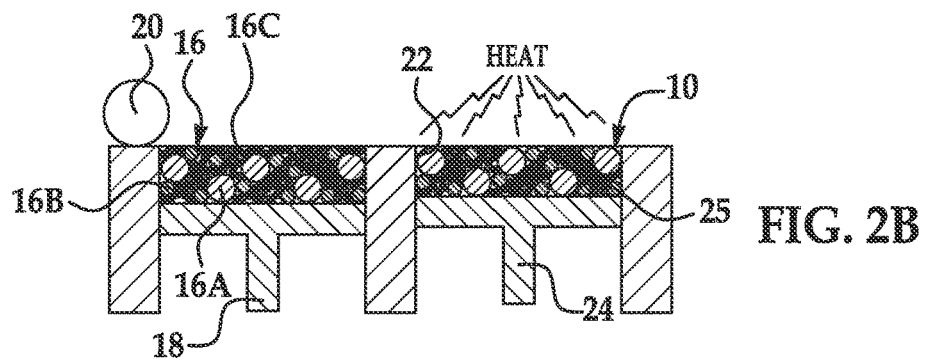

After the layer 10 of the sinterable material 16 is deposited in the fabrication bed 22, the layer 10 is exposed to heating (as shown at reference number 104 in FIG. 1 and in FIG. 2B). Heating is performed to pre-heat the sinterable material 16, and thus it is desirable that the heating temperature be below the melting point of the sinterable material 16. As such, the temperature selected will depend upon the sinterable material 16 that is used. As examples, the heating temperature may be from about 5° C. to about 50° C. below the melting point of the sinterable material. In an example, the heating temperature ranges from about 50° C. to about 350° C. In another example, the heating temperature ranges from about 150° C. to about 170° C. In another example, some or all of the pre-heating may be performed while the sinterable material 16 is still on the supply bed 14.

Pre-heating the layer 10 of the sinterable material 16 may be accomplished using any suitable heat source that exposes all of the sinterable material 16 in the fabrication bed 22 or the supply bed 14 to the heat. Examples of the heat source include a thermal heat source or a light radiation source.

Figure 2C:
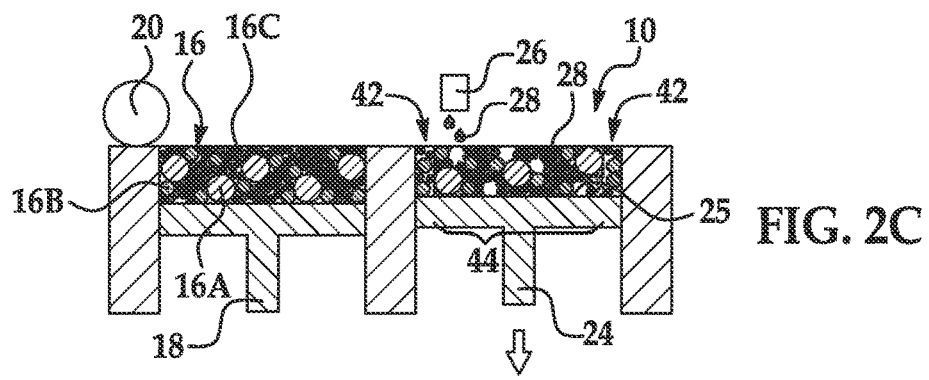

After pre-heating the layer 10, the coalescent agent is selectively applied on a portion of the sinterable material 16 in the layer 10, as shown at reference number 106 in FIG. 1 and in FIG. 2C. As illustrated in FIG. 2C, the coalescent agent 28 may be dispensed from an inkjet printhead 26. While a single printhead is shown in FIG. 2C, it is to be understood that multiple printheads may be used that span the width of the fabrication bed 22. The printhead 26 may be attached to a moving XY stage or a translational carriage (neither of which is shown) that moves the printhead 26 adjacent to the fabrication bed 22 in order to deposit the coalescent agent 28 in desirable area(s).

The printhead 26 may be programmed to receive commands from the central processing unit and to deposit the coalescent agent 28 according to a pattern of a cross-section for the layer of the 3D object that is to be formed. As used herein, the cross-section of the layer of the object to be formed refers to the cross-section that is parallel to the contact surface 25. The printhead 26 selectively applies the coalescent agent 28 on those portion(s) 44 of the layer 10 that are to be fused to become the first layer of the 3D object. As an example, if the first layer is to be shaped like a cube or cylinder, the coalescent agent 28 will be deposited in a square pattern or a circular pattern (from a top view), respectively, on at least a portion 44 of the layer 10 of the sinterable material 16. In the example shown in FIG. 2C, the coalescent agent 28 is deposited in a square pattern on the portion 44 of the layer 10 and not outside the portion 44.

Some examples of suitable coalescent agents 28 are water-based dispersions including a radiation absorbing binding agent (i.e., an active material). The active agent may be an infrared light absorber, a near infrared light absorber, or a visible light absorber. As one example, the coalescent agent 28 may be an ink-type formulation including carbon black as the active material. An example of this ink-type formulation is commercially known as CM997A available from Hewlett-Packard Company. Examples of inks including visible light enhancers as the active agent are dye based colored ink and pigment based colored ink. Examples of pigment based colored inks include the commercially available inks CE039A and CE042A, available from Hewlett-Packard Company.

The aqueous nature of the coalescent agent 28 enables the coalescent agent 28 to penetrate, at least partially, into the layer 10 of the sinterable material 16. The sinterable material 16 may be hydrophobic, and the presence of a co-solvent and/or a surfactant in the coalescent agent 28 may assist in obtaining desirable wetting behavior.

It is to be understood that a single coalescent agent 28 may be selectively applied to form the layer of the 3D object, or multiple coalescent agents 28 may be selectively applied to form the layer of the 3D object.

Figure 2D:
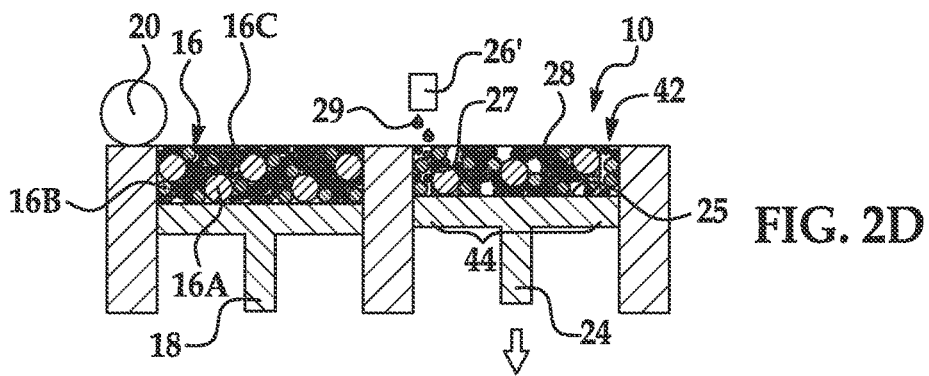
Figure 2E:
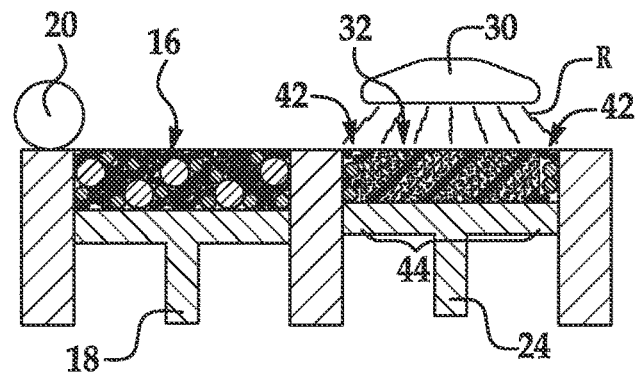

Prior to, concurrently with, or after the coalescent agent 28 is/are selectively applied on the desired portion(s) 44, the modifying agent is selectively applied on different portion(s) of the sinterable material 16, as shown at reference numeral 110 in FIG. 1. An example of the selective application of the modifying agent is schematically shown in FIG. 2D, where reference numeral 29 represents the modifying agent and reference numeral 42 represents the other portions of the sinterable material 16 to which the modifying agent 29 is selectively applied.

It may be desirable to control the amount and/or positioning of the modifying agent 29 that is applied to the sinterable material 16. The modifying agent 29 acts as a coolant, which effectively removes energy and keeps the sinterable material 16 at a temperature that prevents curing or retards the sintering, melting, fusing, and/or curing of the sinterable material 16. As such, prior to actually selectively applying the modifying agent 29, the method 100 further includes determining how to selectively apply the modifying agent 29. This is shown at reference numeral 108 in FIG. 1.

The determination as to how to selectively apply the modifying agent 29 may include determining where to apply the modifying agent 29 and/or determining how much of the modifying agent 29 to apply. These determinations may be made using a thermal diffusion characteristic of the sinterable material 16, a layer to be formed of the sinterable material 16 (i.e., the sintered layer or part), or combinations thereof. The thermal diffusion characteristic may be a time scale/characteristic time of thermal diffusion, a length scale/characteristic length of thermal diffusion, a temperature profile, and/or an energy profile.

Characteristic times and lengths refer to the approximate time or distance required for a system to recover from a perturbation. They are often defined as the time or distance for a perturbation to be reduced to 1/e (~37%) of the initial perturbation. In practice, they are often used to mean the time or distance over which a perturbation has a significant effect. The time scale of thermal diffusion generally refers to the time it takes for the sinterable material to stabilize (approach its equilibrium value) in temperature after energy has been added or removed from an adjoining area of material. The length scale of thermal diffusion generally refers to the distance from the part edge or build surface that experiences a significant temperature increase due to the presence of the hot sintered material. As examples, the distance may be horizontal or vertical with respect to the location of the sintered material. Examples of a significant temperature change or increase include i) a temperature rise of about 25% of the difference between the sintered part/layer temperature and the surrounding sinterable material temperature, or ii) 25% of the difference between the normal temperature of the surrounding sinterable material 16 and the melting temperature of the sinterable material 16. The time and/or length scales of thermal diffusion may be empirically measured, or derived from respective thermal diffusion coefficients or temperature differences in the system. The thermal diffusion coefficients may themselves be empirically determined or estimated from values of similar materials or by chemical modeling methods.

The temperature and or energy profile generally refers to temperature and/or energy differences exhibited by the sinterable material 16 or sintered part/layer with or without an agent 28 and/or 29 applied thereon. As examples, these differences may be observed before radiation exposure (e.g., due to modifying agent evaporation) or after radiation exposure (e.g., due to energy migration). The temperature profile and/or energy profile may be generated using the thermal model, or may be an estimation of a temperature or energy profile. As will be described in more detail below, the estimation of the temperature or energy profile may be based upon manipulating the image data used to form the 3D part layers. Calculating the local variation from mean values of the surrounding region provides a rough estimation of the temperature and/or energy differences in the sintered layer/part where coalescence agent 28 is applied and not applied.

In some of the examples disclosed herein, the appropriate quantity and/or position of the modifying agent 29 may be determined using a time-dependent thermal model of the sintering process. In an example, the thermal model itself may be used to directly calculate the modifying agent quantity and/or identify the modifying agent position. In another example, the thermal model is used to generate a temperature or energy profile, which can be used by a correction algorithm to generate a pattern (e.g., location and/or quantity) for applying the modifying agent 29. In still other examples, one or more thermal models may be used to identify typical time and/or length scales of thermal diffusion. It is believed that the typical length scale and/or time scale may then be used to calculate the modifying agent quantity and/or determine the modifying agent position, without requiring full modeling of the exact geometry of the 3D object to be formed. In other examples disclosed herein, the appropriate quantity and/or position of the modifying agent 29 may be determined empirically.

In the examples involving the time-dependent thermal model of the sintering process, it is to be understood that the thermal model may be generated using a computational modeling method. The computational modeling method is performed by a computer (including hardware components, such as a processor) running/executing computer readable instructions that are stored on a non-transitory, tangible computer readable medium. An example of the computational modeling software is Abaqus FEA version 6.13. In any of the examples disclosed herein, the computer readable medium may include any one of many physical media such as, for example, electronic, magnetic, optical, electromagnetic, or semiconductor media. More specific examples of suitable computer readable media include hard drives, a random access memory (RAM), a read-only memory (ROM), an erasable programmable read-only memory (EPROM), or a portable CD, DVD, or flash drive.

It is to be understood that the computational modeling method or any of the computer-based methods for determining how to apply the modifying agent 29 may be virtualized and configured in a Cloud Computer (i.e., in an Internet-based computing environment). For example, the computer equipment may be accessed as a Cloud platform service, or PaaS (Platform as a Service), utilizing Cloud infrastructure rather than hosting computer equipment at a physical building. The Cloud infrastructure, known as IaaS (Infrastructure as a Service), typically utilizes a platform virtualization environment as a service, which may include components such as the processor, database, server, and other computer equipment.

The computer receives characteristics (e.g., as inputs from a user) that are sufficient to build the thermal model. These characteristics relate to the sinterable material 16 being modeled (e.g., the type of powder, thermal conductivity at different temperatures, heat capacity, and density), the number of layers, the thickness of the layers, the type of coalescence agent 28 being used, a set temperature of the fabrication bed 22, and the time for building a particular layer. In an example, the density, heat capacity, and the thermal diffusivity are provided for both the unsintered sinterable material 16 and the sintered material. The heat capacity change between the unsintered sinterable material 16 and the sintered material may be largely due to the density change between the materials, and thus a single heat capacity value may be adequate. Still other examples of characteristics that may be input to the computer are the energy released when the layer solidifies from a molten state, the temperature at which the sinterable material 16 and coalescent agent 28 are delivered to the fabrication bed 22, and/or the expected energy inputs or losses from the edge surface(s) of the build volume. For some sinterable materials 16, any or all of these parameters/characteristics may vary with temperature. It may be desirable to include the temperature dependent behavior, for example, if the parameters change more than 10% within the temperature range experienced during the build process.

The entered characteristics may also include the differences in temperature, specific heat capacity, and thermal diffusivity between the sinterable material 16 in the portion 44 (to be cured) and the portion 42 (not to be cured). For example, a suitable input may describe the difference in radiation converted to heat by the non-sintered regions (e.g., portion 42) versus the portion(s) 44 with coalescent agent 28 that will convert more of the radiation to heat. This input may be an empirical measurement of the temperature difference between cure/sintered portion(s) 44 and the uncured/unsintered portion(s) 42. Other general characteristics may include a higher specific heat capacity and a lower thermal diffusivity at the portion(s) 42 than at the portion(s) 44.

All of these characteristics are used by the computer (running a suitable software program) to build a thermal model of the layer or object. A finite element analysis or other modeling technique may be used to identify the thermal gradients that develop around the layer or object over a time scale of interest. In an example, the time scale of interest is the time required to build one or several layers. The thermal gradients that develop around the layer/part over the time scale of interest identify the length scale of thermal diffusion for a particular thermal model. The time scale of thermal diffusion may be determined by generating a thermal model with different numbers of part layers that are to be formed, and identifying long the model must be run after the addition of a material layer for convergence of the thermal model to stable predictions at a particular layer.

The temperatures in the vicinity of the layer or object while it is being fabricated can be estimated based upon the model (e.g., using the thermal gradient(s)). As such, the thermal model is used to determine the location and timing of heat flows in and around the layer or object being constructed. More particularly, the excess temperature ($\Delta T$) of the sintered material 16 in the portion 42 (where curing is not desirable) that is above the set temperature of the fabrication bed 22 represents excess energy evolved from the layer or object. The excess temperature may be determined by subtracting the set temperature of the fabrication bed from the temperature of the sintered material 16 in the portion 42 according to the thermal model or an empirical measurement (taken using a high resolution temperature measuring device, such as an IR camera).

This temperature difference ($\Delta T$) can be converted to an excess energy quantity using the specific heat capacity ($Cp_{SM}$), density ($den_{SM}$), and volume ($vol_{SM}$), of the unsintered sinterable material 16 as shown in equation 1:

$$\text{Excess Energy} = Cp_{SM} * vol_{SM} * den_{SM} * \Delta T \quad \text{(eq. 1)}$$

The excess energy for the entire portion 42 can be identified. As such, a map of excess energy around the layer or object can be generated by this method.

The excess energy is equivalent to a quantity of energy to be removed (i.e., removed energy) by the modifying agent 29. As such, the excess energy can be converted to a quantity of the modifying agent 29 that is appropriate to remove this quantity of energy. Using the excess energy map and the converted modifying agent quantity values, a map of the desired quantities of modifying agent 29 around the layer or object can be generated. As such, with this example, both the position and the quantity of the modifying agent 29 to be used may be determined.

The conversion from excess/removed energy to modifying agent quantity may be accomplished using the specific heat capacity ($Cp_{MA}$) of the modifying agent 29 to raise its temperature from the application temperature ($T_{app-MA}$) to the boiling point ($T_{boil-MA}$), plus the heat of vaporization ($H_{vap-MA}$) of the modifying agent 29. The conversion of the excess energy to the quantity of the modifying agent 29 is shown in equation 2 or 3:

$$\text{Removed Energy} = (Cp_{MA} * (T_{boil-MA} - T_{app-MA}) = H_{vap-MA}) * \text{vol. of modifying agent} \quad \text{(eq. 2)}$$

$$\text{Vol. of modifying agent} = \frac{\text{Removed Energy}}{(Cp_{MA} * (T_{boil-MA} - T_{app-MA}) + H_{vap-MA})} \quad \text{(eq. 3)}$$

The application temperature ($T_{app-MA}$) of the modifying agent 29 may be room temperature (from about 18° C. to about 22° C.), a temperature controlled by the printhead 26' (see FIG. 2D) or other application device (e.g., a warming or operating temperature of an inkjet printhead), or a typical temperature that the modifying agent 29 reaches as it is delivered into the heated fabrication bed 22 of the system 12. The sum of the heating and vaporization energy terms multiplied by the volume of the modifying fluid 29 is equal to the total energy that the modifying agent 29 will remove from the system (i.e., the removed energy).

It is to be understood that after the modifying agent 29 is applied to the heated sinterable material 16, the modifying agent 29 evaporates and removes energy from the sinterable material 16. Evaporation may be on the order of a few tenths of a second, which may result in significant removal before the application of the curing energy (i.e., radiation R, see FIG. 2E). This may create a cold region to which energy will migrate over time. In other words, energy may diffuse back into the portion(s) 42 that were cooled by the modifying agent 29 (resulting in a loss of local cooling). This secondary migration of energy (in terms of amount) may be estimated by modeling or empirical methods. Then, the quantity of energy to be removed (i.e., removed energy in equation 3 above) may be increased by this amount to compensate for this effect.

To determine the amount of energy resulting from secondary migration using the thermal model, the thermal model could be allowed to run for a desired delay time after the application of modifying agent 29. The modifying agent 29 may be incorporated in the model as a simple removal of energy at an instant in time, or as a sub-model involving evaporation and other fluid behaviors.

To determine the amount of energy resulting from secondary migration using an empirical method, the temperature measurements described in the following empirical method could be made following a delay after the application of radiation.

One example of an empirical method for determining how to apply the modifying agent 29 will now be described. From this empirical method, a table of the modifying agent quantity versus temperature change effected by the quantity of modifying agent 29 could be constructed. The temperature change refers to a difference between the temperature of the sinterable material 16 (without having any coalescent agent 28 or modifying agent 29 thereon) after being exposed to radiation and the temperature of the sinterable material 16 (having modifying agent 29 thereon) after being exposed to radiation. In this example, any temperature measurements may be performed with any suitable temperature device, such as an infrared (IR) camera, an IR temperature sensor, or low mass thermocouple.

In this example of the method, the table may be constructed by applying different quantities of the modifying agent 29 on respective areas of the sinterable material 16, and applying no modifying agent 29 on one area of the sinterable material 16. The entire sinterable material 16 may then be exposed to radiation. The area with no modifying agent 29 exposed to radiation is referred to as a reference area, and the areas with the different quantities of the modifying agent 29 exposed to radiation are referred to as test areas. The temperature of the reference area and the test areas may be measured. Each test area that received modifying agent after receiving radiation should have a lower temperature than the reference area. For a particular test area, the temperature reduction compared to the reference area is the effect of the associated quantity of modifying agent. The temperature changes may be calculated and correlated with the different quantities of the modifying agent 29 that are used to generate the table. In subsequent 3D printing applications using the same or a similar sinterable material 16 and modifying agent 29, the table may be referenced to determine the quantity of modifying agent 29 to use to effect a desired temperature change.

In still another example, the length scale of thermal diffusion may be empirically determined. In this example, a test layer/part is used. The test layer/part is made up of the same sinterable material 16 and same coalescent agent 28 that is to be used for the actual 3D object/layer. For the test layer/part, the coalescent agent 28 may be applied in a simple geometry, such as a square, or in geometry similar to actual 3D objects. The size of the test part should be large compared with the determined length scale of thermal diffusion, e.g., at least three times the size. In an example, a half inch may be a sufficient size. However, if the determined length scale is larger than ⅓ the object size, the test should be redone using a larger test part size. No modifying agent 29 is used for the test layer/part. After application of the coalescent agent 28 and exposure to radiation, the test layer/part is formed. The position of the coalescent material 28 when forming the test layer/part is compared to the actual extent of material 16 sintering in the test layer/part. During this comparison, the test layer/part is examined for any undesirable sintered material located beyond/outside the edge boundary of the applied coalescent material 28. The length of the undesirable sintered material is measured. This value, or this value multiplied by a scalar correction factor, is the estimated length scale that can be used in other examples. If the actual 3D object geometry was used, the region of undesirable sintered material can be used to estimate the location for the modifying agent 29 during formation of the actual 3D object/layer.

When subsequently forming the actual 3D object/layer, the coalescent agent 28 may be applied in the same position and the modifying agent 29 may be applied along the estimated length scale. The use of the modifying agent 29 close to the edge boundary 27 may reduce the temperature of the sinterable material 16 within the portion(s) 42 at the edges of the layer to be formed, but may also reduce the quality of sintering or melting within the portion(s) 44 along the edge boundary 27. This energy loss within the cross-section of the layer may be compensated for by increasing the quantity of the coalescent agent 28 within the portion(s) 44.

Still further, the thermal model may also predict that the interior of a layer/part is too hot (i.e., excess energy is present). This energy increase within the cross-section of the layer/part may be compensated for by decreasing the quantity of the coalescent agent 28 within the portion(s) 44 and/or increasing a quantity of the modifying agent 29 within the portion(s) 44. In this example, the amount of modifying agent 29 to add may be calculated using equation 3, except in this instance the removed energy is the excess energy at the particular location within the cross-section of the layer/part.

The increased or decreased quantity of the coalescent agent 28 may be determined in an analogous fashion to determining how much modifying agent 29 to selectively apply. For example, the delta temperature values of the thermal model may be converted to an energy quantity, and using a modeled or empirical table of coalescent agent quantity versus energy absorbed, the additional quantity of coalescent agent 28 may be determined.

For concentrations of coalescent agent 28 low enough that Beer's Law (absorbance A=εlc=absorption coefficient*path length*concentration) applies, the quantity of coalescent agent 28 required will have a linear relationship with the desired temperature change. For higher concentrations of the coalescent agent 28, the absorption efficiency may be reduced, and additional coalescent agent 28 may be needed to effect the desired change. This may be modeled or empirically determined by comparing temperatures after radiation is applied to portions of the sinterable material 16 covered with different quantities of coalescing agent. A model based solution may need to incorporate the cooling effect of evaporating any volatile solvents dispensed as part of the coalescent agent 28, in addition to the absorption behavior of the coalescent agent 28, and radiative or convective losses from the surface of the fabrication bed 22.

In other examples, the computer may include a correction algorithm. Using the correction algorithm, a modified image may be generated to correct for the thermal diffusion effects for each layer image of the 3D object to be formed.

Generally, the correction algorithm utilizes 3D shape information for the layer image and a temperature/energy profile associated with the 3D shape to generate a pattern (including location and/or quantity information) for applying the modifying agent 29. The 3D shape information may include information about one layer, several layers, or the entire part, and may also include value(s) that is/are indicative of the selective application of the coalescent agent 28. For example, there may be a spatially varying quantity of coalescent agent 28 that is used in the thermal model or used in the manipulation of the 3D shape information.

In these examples, the 3D shape information may be supplied to the thermal model and the temperature/energy profile may be automatically generated. Alternatively, manipulation of the 3D shape information (described below) may be used to generate an estimation of the temperature/energy profile (in the form of a map of local temperature/energy variation) without using a thermal model.

In an example using manipulation of the 3D shape information, the map of local temperature/energy variation in the build region can be constructed from the 3D layer image based on a spatial averaging technique. In the following example, it is assumed that the original layer image is composed of, or can be converted into data with positive values describing portion(s) 44 that should receive coalescent agent 28, and a value of zero describing portion(s) 42 not receiving the coalescent agent 28. It is to be understood however, that the values may be switched if desirable. These value conventions are used for the purposes of clarity in this example. It is to be understood that other value conventions and math operations could be employed to achieve the intended result.

The radius of the layer image over which an average may be taken may be determined by the characteristic length of thermal diffusion found in the thermal model or by empirical measurement of excess part growth. This empirical measurement may be performed by building parts of nominal lengths using coalescent agent 28, and plotting the dimensional error after radiation exposure (when no modifying agent 29 is used) versus the nominal size. In this example, the intercept of the best fit line with the Y axis (0 length part) should be approximately the characteristic length. This empirical measurement may also be performed as previously described for the length scale (e.g., with the test layer/part).

A rough map of local temperature/energy content can be calculated at each location (i.e. pixel) by averaging the values of all the pixels within the radius of that location. Averaging may be accomplished using a Gaussian averaging function, or some other suitable averaging function. The difference between the original pixel value and the averaged value of all pixels within the specified radius indicates the amount of energy imbalance that may be corrected for using the modifying agent 29 at that pixel location. More particularly, when the averaged pixel value exceeds the actual pixel value (e.g., a negative difference), this indicates that cooling by the modifying agent 29 is desirable. When the actual pixel value exceeds the averaged pixel value (e.g., a positive difference), this indicates that the modifying agent 29 should not be used, or that an additional quantity of coalescent agent 28 may be applied to the location. The positive difference value may be directly added to the original pixel value to modify the coalescent agent 28 quantity, multiplied by a scalar adjustment factor, or used as the index in a look up table to find a quantity to add to the original pixel value. For the modifying agent 29, the negative difference value may be used directly, multiplied by a scalar adjustment factor, or used as the index in a look up table to find a suitable quantity. From the difference values, the pattern for applying the coalescent agent 28 and/or modifying agent 29 may be produced.

It is to be understood that the correction algorithm may result in both positive and negative differences at different portions of the layer image. In these instances, the quantities for both the modifying agent 29 and the coalescent agent 28 may be adjusted. When all positive differences are obtained, the use of the modifying agent 29 may not be desirable.

The final corrected image (i.e., the result of averaged image subtraction or the image modified by thermal model results) may be halftoned, i.e., converted into a spatial pattern of dots corresponding to the intensity information in the corrected image.

Depending on the relative size of the layer fabrication time and the characteristic time for thermal relaxation (cooling down from radiation exposure), it may be desirable to perform the correction algorithm by averaging multiple layers of the 3D object geometry, rather than a single layer.

Whether or not the desired position and/or quantity of the modifying agent 29 is/are determined by modeling or empirically, after the determination is made, the modifying agent 29 is selectively applied in the desired portion(s) 42, or in some instances in portion(s) 44, of the sinterable material 16 (as shown at reference numeral 110 in FIG. 1 and in FIG. 2D).

In the examples disclosed herein, the modifying agent 29 includes a surfactant, a co-solvent, water, and optionally a biocide. In some examples, the modifying agent 29 consists of these components, and no other components. It has been found that this particular combination of components effectively reduces or prevents coalescence bleed, in part because the water and co-solvent provide evaporative cooling to the sinterable material 16 in proximity thereof (e.g., in thermal contact therewith). It is believed that evaporation of 1.3 milligrams per $cm^2$ of the modifying agent 29 can remove up to 3 Joules of energy per $cm^2$ of the sinterable material 16. This energy loss is enough to keep the sinterable material 16 from heating and curing (e.g., which may require 4 to 5 Joules per cm² per 100 micron layer of sinterable material 16).

Moreover, the co-solvent that is used in the modifying agent 29 has a lower thermal diffusivity than water. As such, the co-solvent exhibits less heat transfer than water. This characteristic renders the modifying agent 29 as being capable of reducing the energy flow from the sintered material to the unsintered surroundings having the modifying agent 29 thereon. As such, the modifying agent 29 aids in reducing undesired migration of energy.

Therefore, the modifying agent 29 disclosed herein can effectively reduce or prevent curing of the sinterable material 16 when the sintering material 16 is in thermal contact with the modifying agent 29.

The total amount of co-solvent present in the modifying agent 29 ranges from about 5.0 wt % up to 30 wt % with respect to the total weight of the modifying agent 29. As mentioned above, suitable co-solvents at least have a lower thermal diffusivity than water. In some examples, it may also be desirable that the co-solvent(s) have a boiling point greater than 230° C. Examples of suitable co-solvents and some of their physical properties are provided in Table 1.

TABLE 1

Modifying Agent Co-Solvents

| Solvent | Thermal Diffusivity (mm²/s) | Thermal Conductivity (W/(m * K)) | Specific Heat (J/(g * K)) | Density (g/m³) | Boiling Point (° C.) | Flash Point (° C.) |
|---|---|---|---|---|---|---|
| Water | 0.162 | 0.680 | 4.19 | 1.00E+06 | 100 | N/A |
| Trimethylolpropane | 0.145 | 0.256 | 1.58 | 1.12E+06 | 296 | 148 |
| Glycerol | 0.093 | 0.285 | 2.43 | 1.26E+06 | 290 | 160 |
| 1,2,4-Butanetriol | 0.044 | 0.199 | 3.70 | 1.22E+06 | 304 | 154 |
| 1,5-Pentanediol | 0.069 | 0.211 | 3.08 | 9.94E+05 | 239 | 129 |
| 1,4-Butanediol | 0.105 | 0.211 | 1.99 | 1.01E+06 | 228 | 106 |
| 2-Pyrrolidinone | 0.088 | 0.194 | 1.97 | 1.12E+06 | 245 | 136 |
| 2-Hydroxyethyl-2-Pyrrolidinone | no data | no data | no data | 1.16E+06 | 296 | 133 |
| Tripropylene Glycol (TPG) | 0.082 | 0.165 | 1.97 | 1.02E+06 | 265 | 143 |
| Dipropylene Glycol | 0.075 | 0.167 | 2.18 | 1.02E+06 | 232 | 124 |
| Tetraethylene glycol | 0.078 | 0.191 | 2.18 | 1.12E+06 | 328 | 177 |
| Triethylene glycol | 0.080 | 0.196 | 2.18 | 1.13E+06 | 288 | 166 |
| Tripropylene glycol methyl ether | 0.075 | 0.154 | 2.12 | 9.63E+05 | 243 | 121 |
| Triethylene glycol n-butyl ether | 0.076 | 0.160 | 2.13 | 9.90E+05 | 289 | 156 |

It is believed that combinations of the co-solvents listed in Table 1 may also be used.

The modifying agent 29 also includes the surfactant. The type and amount of surfactant may be selected so that a contact angle with a contact line of the sinterable material 16 is less than 90°. In some instances, the contact angle may be less than 45°, which may be desirable to ensure wetting of the sinterable material 16 with the modifying agent 29.

The components of the modifying agent 29 may be mixed together, and then the amount of surfactant may be adjusted to achieve the desirable contact angle. It has been found that the suitable amount of surfactant may vary depending in part upon the strength of the surfactant and/or whether a combination of surfactants is used. In an example, the surfactant amount may be up to about 1.5 wt % with respect to the total weight of the modifying agent 29. Examples of suitable surfactants include a self-emulsifiable, nonionic wetting agent based on acetylenic diol chemistry (e.g., SURFYNOL® SEF from Air Products and Chemicals, Inc.), a perfluoro-based ethoxylated nonionic fluorosurfactant (CHEMGUARD® S-550-100 from Tyco Fire & Security GMBH LLC), a nonionic fluorosurfactant (e.g., CAPSTONE® fluorosurfactants from DuPont, previously known as ZONYL FSO), and combinations thereof.

As noted above, the modifying agent 29 also includes, in some instances, the biocide. When part of the modifying agent 29, the biocide is present in an amount ranging from about 0.01 wt % to about 0.2 wt % with respect to the total weight of the modifying agent 29. An example of a suitable biocide is an aqueous solution of 1,2-benzisothiazolin-3-one (e.g., PROXEL® GXL from Arch Chemicals, Inc.).

The balance of the modifying agent 29 is water. As such, the amount of water may vary depending upon the amounts of surfactant, co-solvent, and, in some instances, biocide that are included. In an example, the amount of water ranges from about 70 wt % to about 95 wt % of the total weight of the modifying agent 29.

The modifying agent 29 may be selectively applied in a manner similar to the coalescent agent 28. In an example, the modifying agent 29 may be applied at the same time that the coalescent agent 28 is dispensed, using a single pass or using multiple passes. In another example, the modifying agent 29 may be applied before or after the coalescent agent 28 is dispensed.

As depicted in FIG. 2D, the modifying agent 29 may be dispensed from an inkjet printhead 26'. While a single printhead is shown in FIG. 2D, it is to be understood that multiple printheads may be used that span the width of the fabrication bed 22. The printhead 26' may be attached to a moving XY stage or a translational carriage (neither of which is shown) that moves the printhead 26' adjacent to the fabrication bed 22 in order to deposit the modifying agent in desirable area(s). The printhead 26' may be programmed to receive commands from the central processing unit and to deposit the modifying agent 29 in the desired portion(s) 44 and/or 42.

In an example, it may be desirable to enhance, refine, smooth, etc. the edge(s) of the layer of the 3D object that is being formed. In this example, the coalescent agent 28 may be selectively applied according to the pattern of the cross-section (which is parallel to the contact surface 25) for the layer of the 3D object, and the modifying agent 29 may be selectively applied along at least part of an edge boundary 27 of that cross-section. An example of this is shown in FIG. 2D (side cross-sectional view of the system 12) and in FIG. 3 (top view of the sinterable material 16 in the fabrication bed 22). In the example shown in these figures, the shape of the 3D object layer to be formed is a rectangular prism, and the pattern of the cross-section that is parallel to the contact surface 25 is a square or rectangle having edge boundary 27. The sinterable material 16 within the edge boundary 27 is the portion 44 upon which the coalescent agent 28 is selectively applied. The sinterable material 16 positioned between the edge boundary 27 and the edges of the fabrication bed 22 is outside the pattern of the cross-section for the layer to be formed, and thus is the portion 42 upon which the modifying agent 29 is selectively applied.

Figure 4:
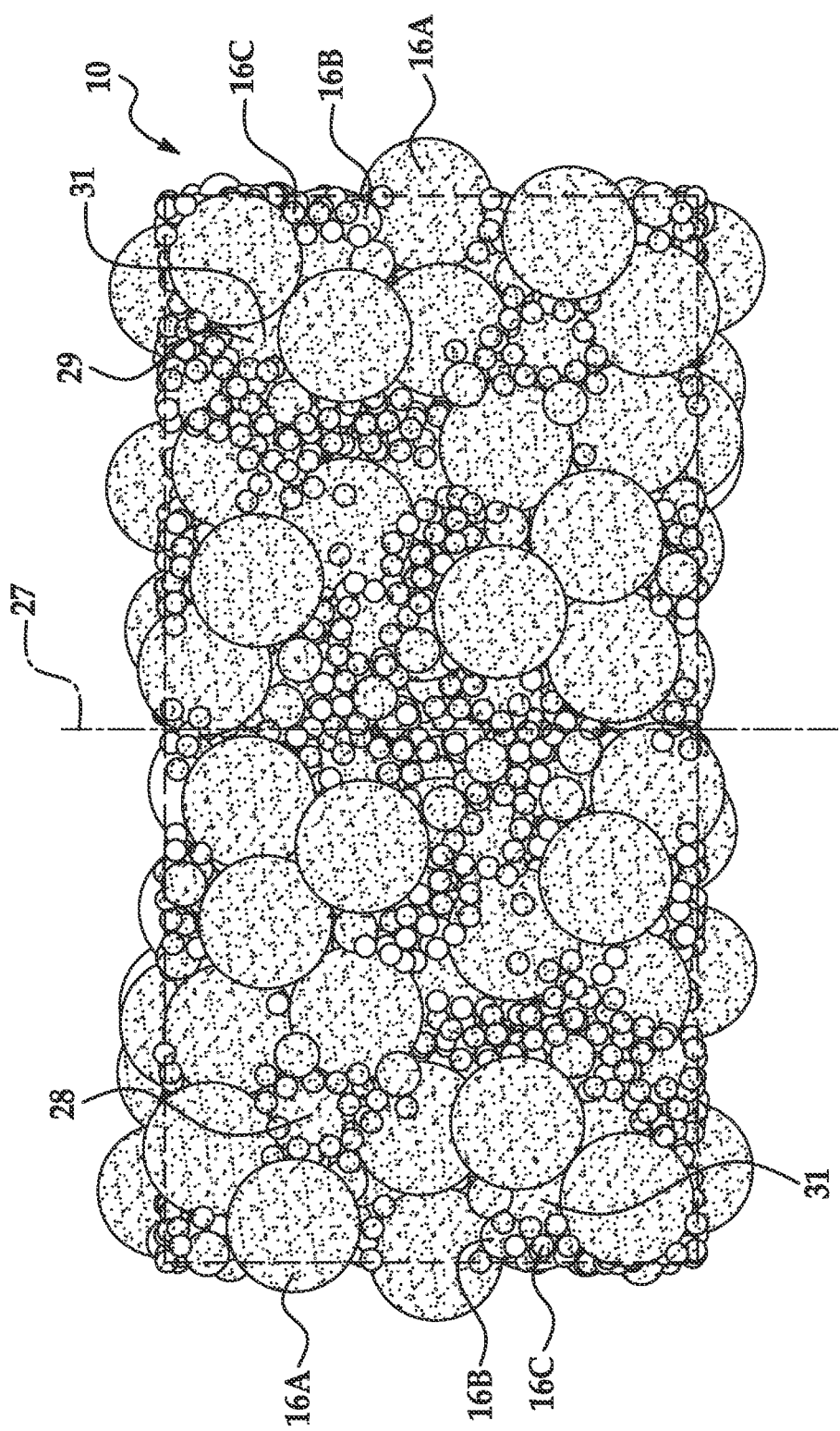
FIG. 4 is front, perspective view of some of the sinterable material in the fabrication bed of FIG. 2D, with the coalescent agent applied on a portion thereof within the cross-section of the 3D object to be formed and with the modifying agent applied on another portion thereof at the edge boundary and outside the cross-section of the 3D object.

Referring briefly to FIG. 4, a front perspective view of some of each of the two portions 42 and 44 is depicted. The view in FIG. 4 illustrates some of the sinterable material 16 after the coalescent agent 28 and modifying agent 29 are applied thereon. As depicted, the coalescent agent 28 may penetrate into at least some of the voids 31 between the particles 16A, 16B, 16C of the sinterable material 16 within the portion 44. Similarly, the modifying agent 29 may penetrate into at least some of the voids 31' between the particles 16A, 16B, 16C of the sinterable material 16 within the portion 42 outside of the edge boundary 27. In other examples, the coalescent agent 28 and/or modifying agent 29 may not penetrate into the voids 31, 31', but may spread out over the exposed surface of the layer 10 of the sinterable material 16. In the example shown in FIGS. 2D, 3, and 4, the modifying agent 29 is capable of preventing curing (fusing, sintering, etc.) of the portion 42 of the sinterable material 16, while the coalescent agent 28 is capable of enhancing curing (fusing, sintering, etc.) of the portion 44 of the sinterable material 16.

In another example, it may be desirable to reduce the amount of energy (or temperature) within the pattern of the cross-section (which is parallel to the contact surface 25) for the layer of the 3D object. In this example, the coalescent agent 28 may be selectively applied according to the pattern of the cross-section (which is parallel to the contact surface 25) for the layer of the 3D object, but the amount may be lowered to reduce the amount of energy in the desired areas. Alternatively, in this example, the coalescent agent 28 may be selectively applied according to the pattern of the cross-section (which is parallel to the contact surface 25) for the layer of the 3D object, and the modifying agent 29 may be selectively applied within at least a portion of that cross-section in order to reduce the amount of energy in the desired areas. As such, the modifying agent 29 may be applied to all or some of the portion 44 of the sinterable material 16 upon which the coalescent agent 28 is applied. As an example, the modifying agent 29 may be applied at or near the center of the portion 44 of the sinterable material 16 that exhibits a higher temperature during curing, and may not be applied near the edge boundary 27 of the portion 44 of the sinterable material 16.

After the coalescent agent 28 and the modifying agent 29 are selectively applied in the desired portions 44 and 42, respectively, the entire layer 10 of the sinterable material 16 is exposed to radiation R. This is shown at reference numeral 112 of FIG. 1 and in FIG. 2E.

The radiation R is emitted from a radiation source 30, such as an IR, near-IR, UV, or visible curing lamp, IR, near-IR, UV, or visible light emitting diodes (LED), or lasers with specific wavelengths. The radiation source 30 used will depend, at least in part, on the type of coalescent agent 28 that is used. The radiation source 30 may be attached, for example, to a carriage that also holds the printhead(s) 26, 26'. The carriage may move the radiation source 30 into a position that is adjacent to the fabrication bed 22. The radiation source 30 may be programmed to receive commands from the central processing unit and to expose the layer 10, including the coalescent agent 28 and modifying agent 29, to radiation R. The length of time the radiation R is applied for, or energy exposure time, may be dependent, for example, on one or more of: characteristics of the radiation source 30; characteristics of the sinterable material 16; and/or characteristics of the coalescent agent 28.

The time between selective application of the coalescent agent 28 and the modifying agent 29 and exposure to radiation may range anywhere from 0.05 seconds to about 6 seconds. In order to achieve the desired cooling effect from the modifying agent 29 disclosed herein, the time between application and radiation exposure may be decreased and/or the amount of modifying agent 29 may be increased. Making time and/or quantity adjustments ensures that the temperature of the selected portions remains depressed for a time sufficient to suppress curing in the portion(s) 42 while curing takes place in the portion(s) 44. This is desirable because when the portion(s) 42 are colder than their surroundings due to evaporation, energy migration into the portion(s) 42 may occur over time.

The coalescent agent 28 enhances the absorption of the radiation R, converts the absorbed radiation to thermal energy, and promotes the transfer of the thermal energy to the sinterable material 16 in proximity thereof (i.e., the sinterable material 16 within thermal contact of the coalescence agent 28). In an example, the coalescent agent 28 sufficiently elevates the temperature of the sinterable material 16 in the portion 44 above the melting point(s), allowing curing (e.g., sintering, binding, fusing, etc.) of the particles 16A, 16B, 16C to take place.

Still further, it is to be understood that portions 42 of the sinterable material 16 that do not have the coalescent agent 28 applied thereto but do have the modifying agent 29 applied thereto do absorb some energy. However, the modifying agent 29 may diffuse the absorbed energy to the adjacent sinterable material 16 more slowly, and evaporation of the modifying agent 29 removes energy. As such, in these instances, the particles 16A, 16B, 16C within the portion(s) 42 generally do not exceed the melting point(s) of the particles 16A, 16B, 16C and do not cure.

Exposure to radiation R forms one layer 32 of the 3D object 40 (see FIG. 2F) to be formed.

Steps 102 through 112 of FIG. 1 (shown and described in reference to FIGS. 2A through 2F) may be repeated as many times as desirable to create subsequent layers 34, 36, 38 (FIG. 2F) and to ultimately form the 3D object 40. It is to be understood that heat absorbed during the application of energy from a portion of the sinterable material 16 on which coalescent agent 28 has been delivered may propagate to a previously solidified layer, such as layer 32, causing at least some of that layer to heat up above its melting point. This effect helps create strong interlayer bonding between adjacent layers of the 3D object 40.

Figure 2F:
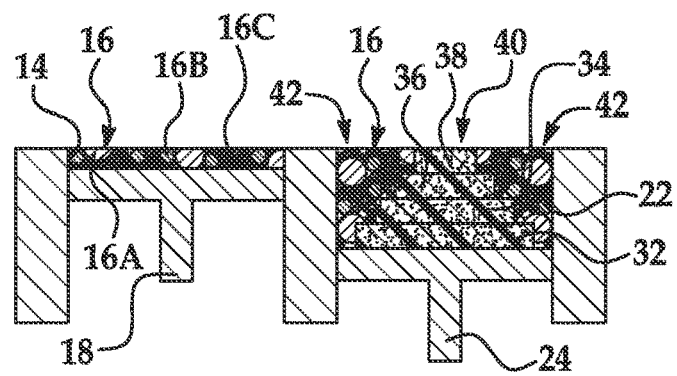
Figure 3:
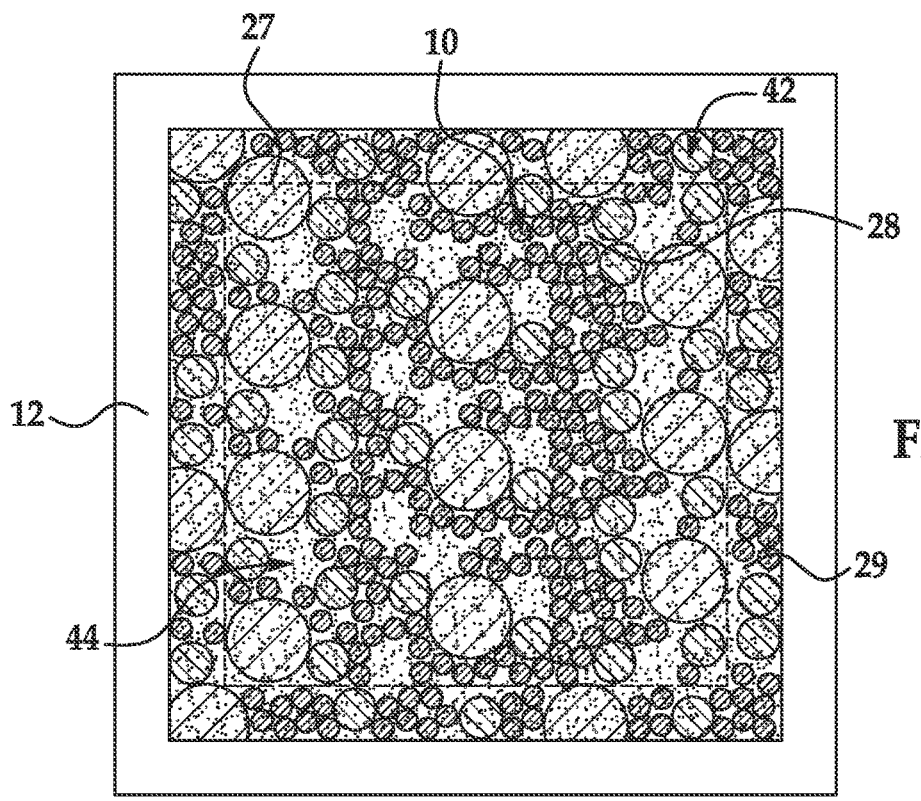
FIG. 3 is a top, schematic view of the sinterable material in the fabrication bed of FIG. 2D, with a coalescent agent applied on a portion thereof within a cross-section of the layer to be formed and with a modifying agent applied on another portion thereof at an edge boundary.

FIG. 2F illustrates one example of the 3D object 40 in the fabrication bed 22. It is to be understood, however, that the subsequently formed layers 34, 36, 38 may have any desirable shape and/or thickness and may be the same as or different from any other layer 32, 34, 36, 38 depending upon the size, shape, etc. of the 3D object 40 that is to be formed.

As illustrated in FIG. 2F, as subsequent layers 34, 36, 38 have been formed, the delivery piston 18 is pushed closer to the opening of the delivery bed 14, and the supply of the sinterable material 16 in the delivery bed 14 is diminished (compared, for example, to FIG. 2A at the outset of the method). The fabrication piston 24 is pushed further away from the opening of the fabrication bed 22 in order to accommodate the subsequent layer(s) of sinterable material 16, the selectively applied coalescent agent 28, and the selectively applied modifying agent 29. Since at least some of the sinterable material 16 remains uncured after each layer 32, 34, 36, 38 is formed, the 3D object 40 is at least partially surrounded by the uncured sinterable material 16 and modifying agent 29 in the fabrication bed 22.

When the 3D object 40 is complete, it may be removed from the fabrication bed 22, and the uncured sinterable material 16 and modifying agent 29 may be separated from one another. This may be accomplished by washing with water. The uncured sinterable material 16 may be washed and then reused.

Figure 5:
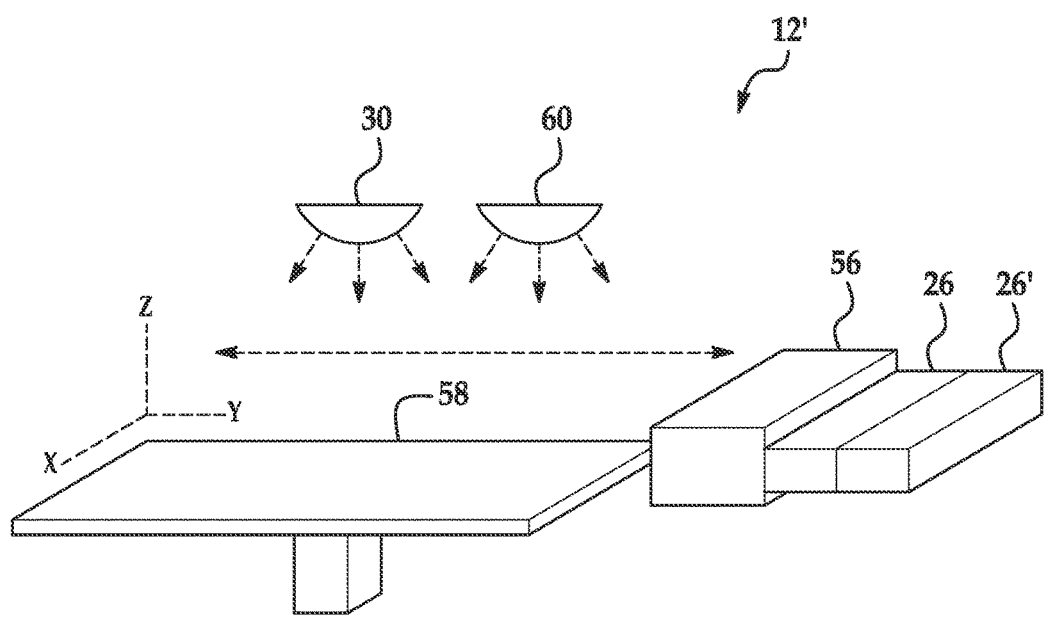
FIG. 5 is a simplified isometric view of an example of a 3D printing system that may be used in an example of the 3D printing method as disclosed herein.
Figure 5:
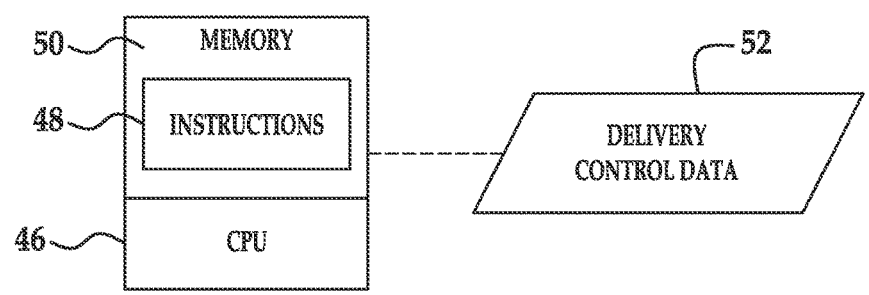
Figure 6A:
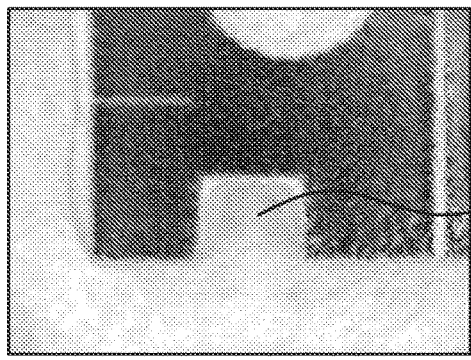
FIGS. 6A-6F are photographs of a part formed using an example of the modifying agent disclosed herein (FIG. 6A) and comparative parts formed with comparative modifying agents (FIGS. 6B-6F)
Figure 6D:
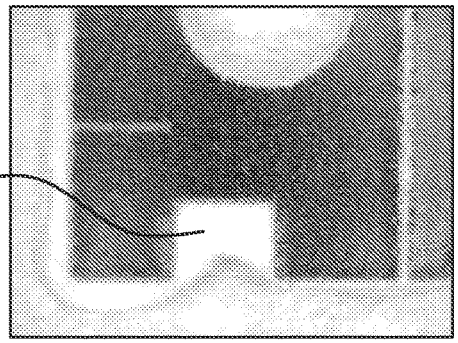
Figure 6B:
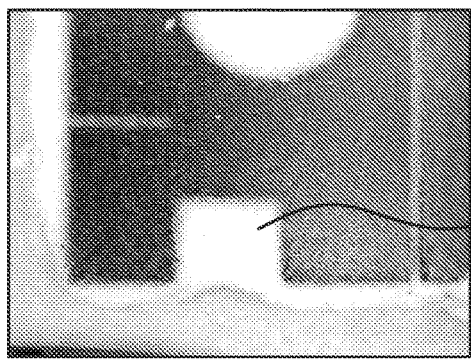
Figure 6E:
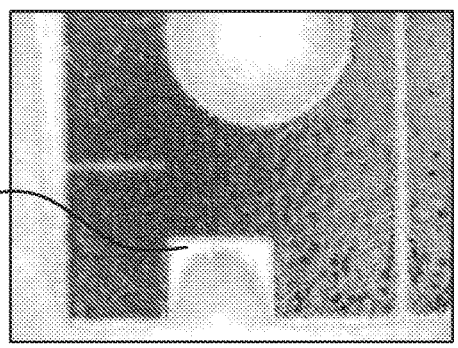
Figure 6C:
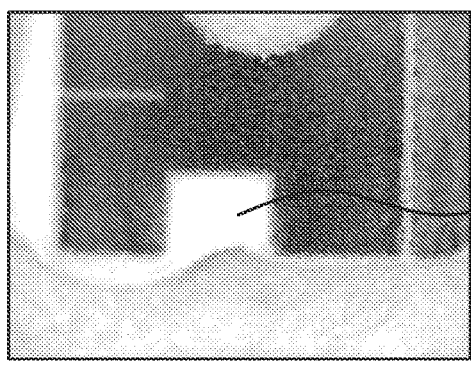
Figure 6F:
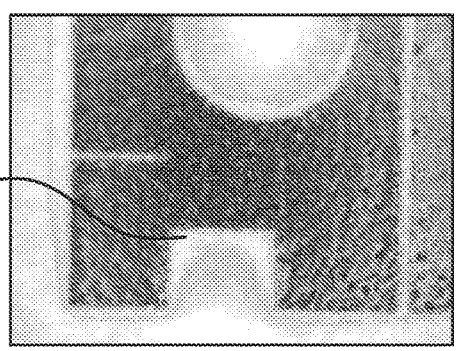

Referring now to FIG. 5, another example of the printing system 12' is depicted. The system 12' includes a central processing unit 46 that controls the general operation of the additive printing system 12'. As an example, the central processing unit 46 may be a microprocessor-based controller that is coupled to a memory 50, for example via a communications bus (not shown). The memory 50 stores the computer readable instructions 48. The central processing unit 46 may execute the instructions 48, and thus may control operation of the system 12' in accordance with the instructions 48.

In this example, the printing system 12' includes a coalescent agent distributor 26 to selectively deliver coalescent agent 28 to portion(s) 44 of the layer (not shown in this figure) of sinterable material 16 provided on a support member 58. In this example, the printing system 12' also includes a modifying agent distributor 26' to selectively deliver modifying agent 29 to other portion(s) 42 and/or the portion(s) 44 of the layer (not shown in this figure) of sinterable material 16 provided on a support member 58.

In an example, the support member 58 has dimensions ranging from about 10 cm by 10 cm up to about 100 cm by 100 cm, although the support member 58 may have larger or smaller dimensions depending upon the 3D object 40 that is to be formed.

The central processing unit 46 controls the selective delivery of the coalescent agent 28 and the modifying agent 29 to the layer of the sinterable material 16 in accordance with delivery control data 52.

In the example shown in FIG. 5, it is to be understood that the distributors 26, 26' are printheads, such as thermal printheads or piezoelectric inkjet printheads. The printheads 26, 26' may be drop-on-demand printheads or continuous drop printheads.

The printheads 26, 26' may be used to selectively deliver the coalescent agent 28 and modifying agent 29, respectively, when in the form of a suitable fluid. As described above, each of the coalescent agent 28 and the modifying agent 29 includes a vehicle, such as water, co-solvent(s), surfactant(s), etc., to enable it to be delivered via the printheads 26, 26'.

In one example the printhead 26, 26' may be selected to deliver drops of the coalescent agent 28 and the modifying agent 29 at a resolution ranging from about 180 dots per inch (DPI) to about 1200 DPI. In other examples, the printhead 26, 26' may be selected to be able to deliver drops of the coalescent agent 28 and the modifying agent 29 at a higher or lower resolution. The drop velocity may range from about 8 m/s to about 24 m/s and the firing frequency may range from about 1 kHz to about 48 kHz. In an example, it may be desirable that 0.3-1.0 milligram/cm$^2$ of the modifying agent 29 be delivered in selected portions per layer of the object being built.

Each printhead 26, 26' may include an array of nozzles through which the printhead 26, 26' is able to selectively eject drops of fluid. In one example, each drop may be in the order of from about 6 pico liters (pl) per drop to about 10 pico liters (pl) per drop, although it is contemplated that a higher or lower drop size may be used. In some examples, printheads 26, 26' are able to deliver variable size drops.

The printheads 26, 26' may be an integral part of the printing system 12', or it may be user replaceable. When the printheads 26, 26' are user replaceable, they may be removably insertable into a suitable distributor receiver or interface module (not shown).

In another example of the printing system 12', a single inkjet printhead may be used to selectively deliver both the coalescent agent 28 and the modifying agent 29. For example, a first set of printhead nozzles of the printhead may be configured to deliver the coalescent agent 28, and a second set of printhead nozzles of the printhead may be configured to deliver the modifying agent 29.

As shown in FIG. 5, each of the distributors 26, 26' has a length that enables it to span the whole width of the support member 58 in a page-wide array configuration. In an example, the page-wide array configuration is achieved through a suitable arrangement of multiple printheads. In another example, the page-wide array configuration is achieved through a single printhead with an array of nozzles having a length to enable them to span the width of the support member 58. In other examples of the printing system 12', the distributors 26, 26' may have a shorter length that does not enable them to span the whole width of the support member 58.

While not shown in FIG. 5, it is to be understood that the distributors 26, 26' may be mounted on a moveable carriage to enable them to move bi-directionally across the length of the support member 58 along the illustrated y-axis. This enables selective delivery of the coalescent agent 28 and modifying agent 29 across the whole width and length of the support member 58 in a single pass. In other examples, the distributors 26, 26' may be fixed while the support member 58 is configured to move relative thereto.

As used herein, the term 'width' generally denotes the shortest dimension in the plane parallel to the X and Y axes shown in FIG. 5, and the term 'length' denotes the longest dimension in this plane. However, it is to be understood that in other examples the term 'width' may be interchangeable with the term 'length'. As an example, the distributors 26, 26' may have a length that enables it to span the whole length of the support member 58 while the moveable carriage may move bi-directionally across the width of the support member 58.

In examples in which the distributors 26, 26' have a shorter length that does not enable them to span the whole width of the support member 58, the distributors 26, 26' may also be movable bi-directionally across the width of the support member 58 in the illustrated X axis. This configuration enables selective delivery of the coalescent agent 28 and modifying agent 29 across the whole width and length of the support member 58 using multiple passes.

The distributors 26, 26' may respectively include therein a supply of the coalescent agent 28 and modifying agent 29, or may be respectively operatively connected to a separate supply of the coalescent agent 28 and modifying agent 29.

As shown in FIG. 5, the printing system 12' also includes a sinterable material distributor 56. This distributor 56 is used to provide the layer (e.g., layer 10) of the sinterable material 16 on the support member 58. Suitable sinterable material distributors 56 may include, for example, a wiper blade, a roller, or combinations thereof.

The sinterable material 16 may be supplied to the sinterable material distributor 56 from a hopper or other suitable delivery system. In the example shown, the sinterable material distributor 56 moves across the length (Y axis) of the support member 58 to deposit a layer of the sinterable material 16. As previously described, a first layer of sinterable material 16 will be deposited on the support member 58, whereas subsequent layers of the sinterable material 16 will be deposited on a previously deposited (and solidified) layer.

It is to be further understood that the support member 58 may also be moveable along the Z axis. In an example, the support member 58 is moved in the Z direction such that as new layers of sinterable material 16 are deposited, a predetermined gap is maintained between the surface of the most recently formed layer and the lower surface of the distributors 26, 26'. In other examples, however, the support member 58 may be fixed along the Z axis and the distributor 26 may be movable along the Z axis.

Similar to the system 12, the system 12' also includes the radiation source 30 to apply energy to the deposited layer of sinterable material 16, the coalescent agent 28, and the modifying agent 28 to cause the solidification of portion(s) 44 of the sinterable material 16. Any of the previously described radiation sources 30 may be used. In an example, the radiation source 30 is a single energy source that is able to uniformly apply energy to the deposited materials, and in another example, radiation source 30 includes an array of energy sources to uniformly apply energy to the deposited materials.

In the examples disclosed herein, the radiation source 30 is configured to apply energy in a substantially uniform manner to the whole surface of the deposited sinterable material 16. This type of radiation source 30 may be referred to as an unfocused energy source. Exposing the entire layer to energy simultaneously may help increase the speed at which a three-dimensional object may be generated.

While not shown, it is to be understood that the radiation source 30 may be mounted on the moveable carriage or may be in a fixed position.

The central processing unit 46 may control the radiation source 30. The amount of energy applied may be in accordance with delivery control data 52.

The system 12' may also include a pre-heater 60 that is used to pre-heat the deposited sinterable material 16 (as shown and described in reference to FIG. 2B). The use of the pre-heater 60 may help reduce the amount of energy that has to be applied by the radiation source 30.

To further illustrate the present disclosure, examples are given herein. It is to be understood that these examples are provided for illustrative purposes and are not to be construed as limiting the scope of the present disclosure.

EXAMPLE 1

An example modifying agent (Example) and several comparative modifying agents (Comp. 1-Comp. 5) were prepared. The formulations (denoted IF) are shown in Table 2.

TABLE 2

| Components | IF7 Example | IF Comp. 1 | IF4 Comp. 2 | IF6 Comp. 3 | IF8 Comp. 4 | IF9 Comp. 5 |
|---|---|---|---|---|---|---|
| | | | Weight Percent | | | |
| Potassium phosphate dibasic trihydrate ($K_2HPO_4$—$3H_2O$) | 0 | 0 | 27.5 | 0 | 0 | 0 |
| Potassium Iodide (KI) | 0 | 20 | 0 | 0 | 20 | 20 |
| Tripropylene glycol | 0 | 0 | 0 | 50 | 20 | 10 |
| 2-Hydroxyethyl-2-Pyrrolidinone | 8 | 6 | 6 | 0 | 0 | 0 |
| 1,6-Hexanediol | 0 | 3 | 3 | 0 | 0 | 0 |
| 2-Pyrrolidinone (2-P) | 0 | 7 | 7 | 0 | 0 | 0 |
| Tetraethylene glycol | 0 | 3 | 3 | 0 | 0 | 0 |
| Glycerol | 0 | 0 | 0 | 0 | 0 | 10 |
| SURFYNOL ® SEF | 0.75 | 0.75 | 0.75 | 0.75 | 0.75 | 0.75 |
| CHEMGUARD ® S 550-L-100 | 0.05 | 0.05 | 0.05 | 0.05 | 0.05 | 0.05 |
| CRODAFOS ® N-3 | 0 | 1 | 1 | 1 | 1 | 1 |
| PROXEL ® GXL | 0.1 | 0.1 | 0.1 | 0.1 | 0.1 | 0.1 |
| Deionized Water | Balance | Balance | Balance | Balance | Balance | Balance |

Symmetrical parts were formed using light area processing. A 100 um layer of PA2200 polyamide 12 sinterable material available from Electro Optical Systems GmbH was applied. HP CM991A ink available from Hewlett Packard Company was applied as a coalescent agent with an inkjet printer on the sinterable material in the pattern of the part. The example and comparative example modifying agents were applied to the sinterable material at the edges of half of the pattern. The printer settings included a 160° C. fabrication bed set point and a 20 second layer cycle time. 40 layers of material were deposited, patterned, and cured.

The formed parts were exposed to cleaning in soapy water with a toothbrush to remove unsintered sinterable material and to evaluate the performance of the modifying agents.

Photographs of the parts after cleaning are shown in FIGS. 6A through 6F. Table 3 links the figures to the various parts and the modifying agent used during fabrication of the respective parts.

TABLE 3

| Part and Modifying Agent used | FIG. |
|---|---|
| Example Part formed using IF7 Example | 6A |
| Comp. Part 1 formed using IF Comp. 1 | 6B |
| Comp. Part 2 formed using IF4 Comp. 2 | 6C |
| Comp. Part 3 formed using IF6 Comp. 3 | 6D |
| Comp. Part 4 formed using IF8 Comp. 4 | 6E |
| Comp. Part 5 formed using IF9 Comp. 5 | 6F |

The respective modifying agents had been applied along the bottom edge and within the square shaped notch during the fabrication of each of the parts. In comparing FIGS. 6A through 6F, it is clear that the Example Part (FIG. 6A, formed with the Example modifying agent consisting of water, co-solvent with a desirable thermal diffusivity and in a desired range, and surfactants) had the least amount of sinterable material 16 in the portions where the modifying agent had been applied. The comparative parts (FIGS. 6B-6F), formulated with salts and/or a high (greater than 30 wt %) amount of co-solvent(s) did not clear the notch as well. Rather, the unsintered sinterable material cakes (i.e., builds up) within the notch in the comparative parts.

After the evaluation, each of the parts was also exposed to sandblasting for harsher cleaning. Similar results to those shown in FIGS. 6A through 6F were obtained.

EXAMPLE 2

A modifying agent including about 90 wt % water and about 8 wt % glycol ether was prepared.

A 100 μm layer of PA2200 polyamide 12 sinterable material available from Electro Optical Systems GmbH was applied. HP CM991A ink available from Hewlett Packard Company was applied as a coalescent agent with an inkjet printer on the sinterable material in the pattern of the part. The modifying agent, in a quantity ranging from 0 mg/cm$^2$ per layer to 1.3 mg/cm$^2$ per layer, was applied to the sinterable material at the edges of respective saw tooth shapes. The printer settings included a 160° C. fabrication bed set point and a 20 second layer cycle time. 40 layers of material were deposited, patterned, and cured.

Figure 7:
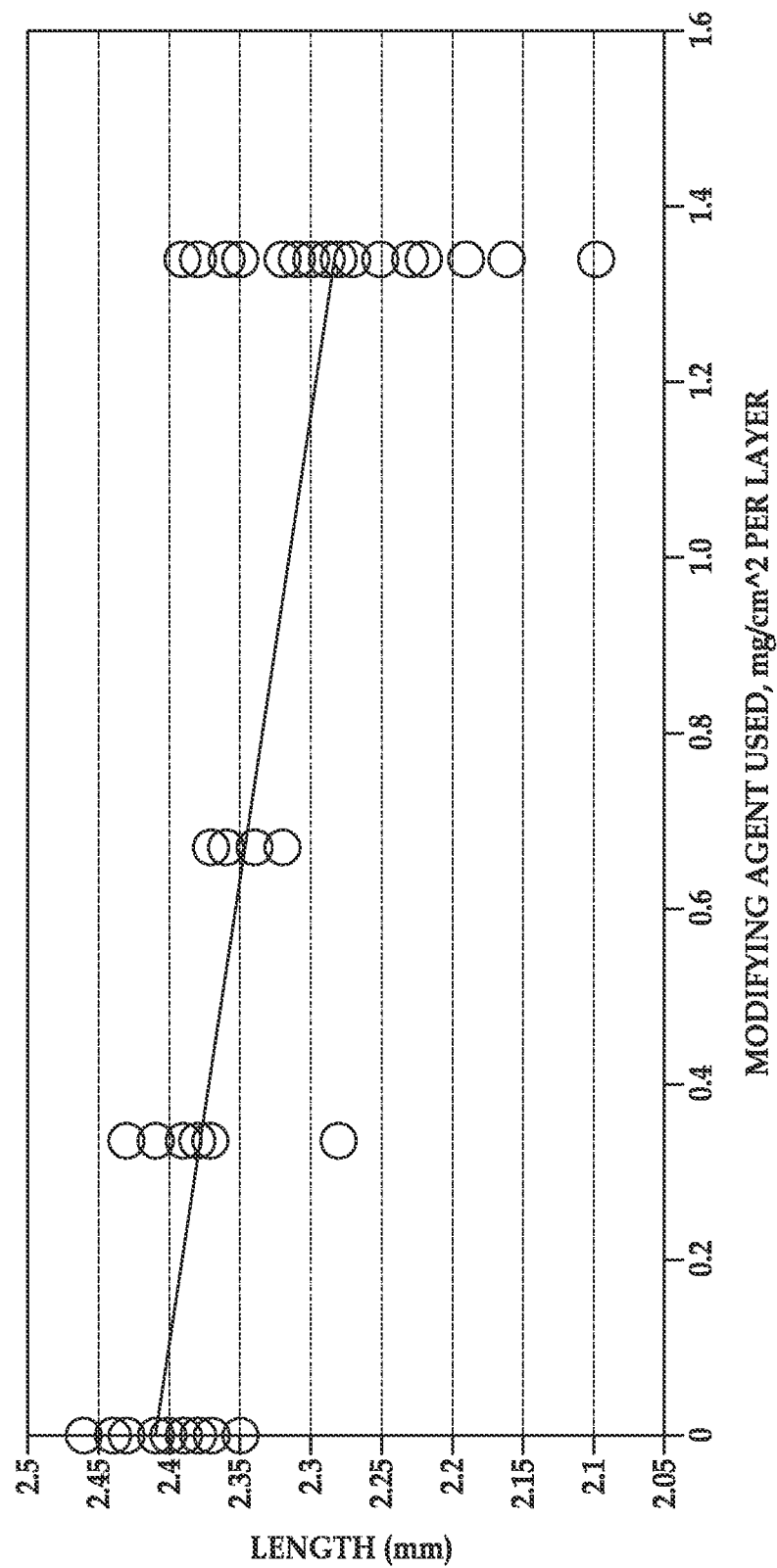
FIG. 7 is a graph of tooth length versus drops of modifying agent.

The tooth length in mm was measured after the part was formed to evaluate the effect of the quantity of modifying agent. FIG. 7 illustrates a graph of the tooth length versus the quantity of modifying agent. It appears that 1.3 mg/cm$^2$ of the modifying agent may provide too much cooling and undesirably reduce the pattern length. These results demonstrate that it may be desirable to determine the quantity of modifying agent to apply using the examples disclosed herein.

Figure 8A:
FIGS. 8A through 8D are photographs of parts formed using differing amounts of a modifying agent.
Figure 8B:
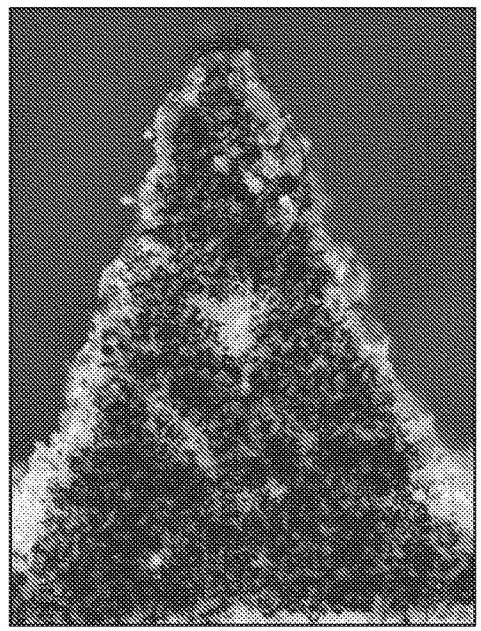
Figure 8C:
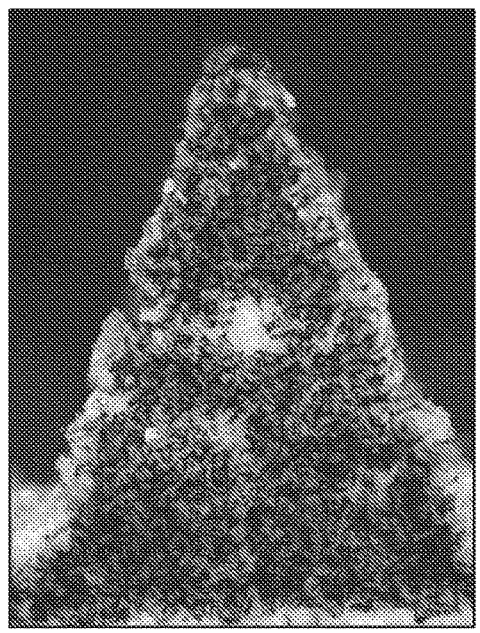
Figure 8D:
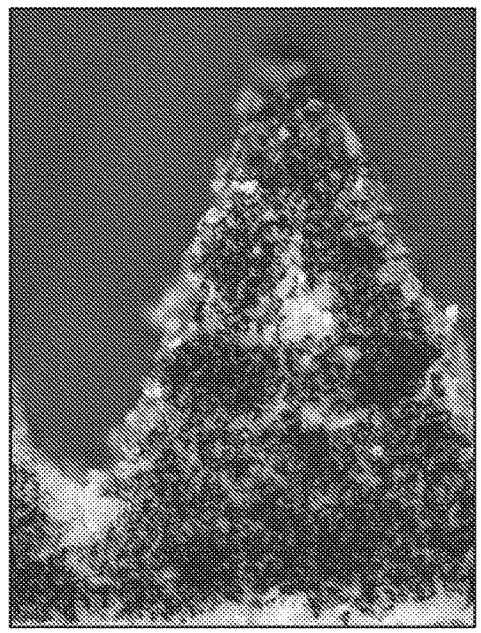

FIGS. 8A through 8D are photographs of the part formed in this example. FIG. 8A shows the saw tooth with no modifying agent (i.e., 0 mg/cm$^2$ per layer) applied at its edge. FIG. 8B shows the saw tooth with modifying agent applied around its edge and extending 2 mm beyond the end of the tooth in a quantity of 0.33 mg/cm$^2$ per layer. FIG. 8C shows the saw tooth with modifying agent applied at its edge in a quantity of 0.66 mg/cm$^2$ per layer. FIG. 8D shows the saw tooth with modifying agent applied at its edge in a quantity 1.3 mg/cm$^2$ per layer. The black region of the saw tooth indicates the area marked with coalescent agent, which represents the desired dimensions of the feature. There is more white undesired sintered material present at the edge of the saw tooth in FIG. 8A as compared to FIGS. 8B-8D. FIGS. 8B through 8D represent increasing quantities (0.33, 0.66, 1.33 mg/cm$^2$) of modifying agent deposited next to the coalescent agent region. The amount of undesired white sintered material is reduced in each consecutive image.

EXAMPLE 3

The modifying agent of Example 2 was also used in this Example.

A 100 μm layer of PA2200 polyamide 12 sinterable material available from Electro Optical Systems GmbH was applied. HP CM991A ink available from Hewlett Packard Company was applied as a coalescent agent with an inkjet printer on the sinterable material in the pattern of the part. The modifying agent was applied, in quantities of 0, 0.66, and 1.33 mg/cm$^2$ per layer, to the sinterable material at the edges of respective saw tooth shapes. The printer settings included a 160° C. fabrication bed set point and a 20 second layer cycle time. 40 layers of material were deposited, patterned, and cured. A time delay of 2 seconds or 4 seconds was introduced before curing.

The tooth length in mm was measured after the part was formed to evaluate the effect of the amount of modifying agent and delay in curing. These results are shown in Table 4.

TABLE 4

| Part | Delay Before Cure (sec) | Modifying Agent (mg/cm$^2$) | Measured Feature Length (mm) |
|---|---|---|---|
| Comp. Example 1 | 2 | 0 | 2.40 |
| Example 2 | 2 | 0.66 | 2.32 |
| Example 3 | 2 | 1.33 | 2.15 |
| Comp. Example 4 | 4 | 0 | 2.45 |
| Example 5 | 4 | 0.66 | 2.33 |
| Example 6 | 4 | 1.33 | 2.28 |

From the results in Table 4, the use of the modifying agent as opposed to no modifying agent reduces the tooth length. This indicates that undesirable sinterable material cakes at the edges of the tooth when no modifying agent is used. In addition, when the same amount of modifying agent was used, the shorter delay in curing resulted in slightly reduced tooth lengths when compared to the longer delay in curing (compare Example 2 with Example 5 and Example 3 with Example 6).

The examples of the modifying agent 29 disclosed herein may effectively reduce undesirable sinterable material caking at or near the edge boundary 27, may reduce coalescence bleed, and/or may reduce the level of curing and/or prevent curing of sinterable material 16 at or near the edge boundary 27 within portion(s) 42.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 50° C. to about 350° C. should be interpreted to include not only the explicitly recited limits of about 50° C. to about 350° C., but also to include individual values, such as 57° C., 95° C., 125° C., 250° C., etc., and sub-ranges, such as from about 70° C. to about 225° C., from about 60° C. to about 170° C., etc. Furthermore, when "about" is utilized to describe a value, this is meant to encompass minor variations (up to +/−10%) from the stated value.

In describing and claiming the examples disclosed herein, the singular forms "a", "an", and "the" include plural referents unless the context clearly dictates otherwise.

While several examples have been described in detail, it will be apparent to those skilled in the art that the disclosed examples may be modified. Therefore, the foregoing description is to be considered non-limiting.

What is claimed is:

1. A three-dimensional (3D) printing method, comprising:
applying a sinterable material;
heating the sinterable material to a temperature ranging from about 50° C. to about 350° C.;
selectively applying a coalescent agent on a portion of the sinterable material;
determining how to selectively apply a modifying agent on an other portion of the sinterable material using a thermal diffusion characteristic of i) the sinterable material, ii) a layer to be formed of the portion sinterable material, or iii) both i and ii, the modifying agent including:
from about 70 wt % to about 95 wt % water;
from about 5 wt % up to 30 wt % of a co-solvent having a lower thermal diffusivity than water;
a surfactant; and
optionally a biocide;
wherein the determining involves:
estimating a length scale of thermal diffusion using a cured layer having been formed with a same type of sinterable material, a same position for the selectively applied coalescent agent, and without the modifying agent; and
identifying at least a location for the selective application of the modifying agent from the length scale;
selectively applying the amount of the modifying agent on an other portion of the sinterable material; and
exposing the sinterable material to radiation, whereby the coalescent agent at least partially cures the portion of the sinterable material in proximity of the coalescent agent, and the modifying agent reduces or prevents curing of the other portion of the sinterable material in proximity of the modifying agent.

2. A three-dimensional (3D) printing method, comprising:
applying a sinterable material;
heating the sinterable material to a temperature ranging from about 50° C. to about 350° C.;
selectively applying a coalescent agent on a portion of the sinterable material;
determining how to selectively apply a modifying agent on another portion of the sinterable material using a thermal diffusion characteristic of i) the sinterable material, ii) a layer to be formed of the portion sinterable material, or iii) both i and ii, the modifying agent including:
from about 70 wt % to about 95 wt % water;
from about 5 wt % up to 30 wt % of a co-solvent having a lower thermal diffusivity than water;
a surfactant; and
optionally a biocide;
wherein the layer is to be formed of the portion of the sinterable material;
wherein the determining is accomplished by:
creating, by a computer running computer readable instructions stored on a non-transitory, tangible computer readable storage medium, a thermal diffusion model of the layer to be formed of the sinterable material; and
calculating, by the computer, a quantity of the modifying agent to be selectively applied based upon the thermal diffusion model; and
wherein the calculating includes:
from the thermal diffusion model, determining an excess temperature of the other portion of the sinterable material that is above a set temperature for a fabrication bed;
converting the excess temperature to a quantity of excess energy; and
converting the quantity of excess energy to the quantity of the modifying agent that is effective for removing the excess energy;
selectively applying the amount of the modifying agent on another portion of the sinterable material; and
exposing the sinterable material to radiation, whereby the coalescent agent at least partially cures the portion of the sinterable material in proximity of the coalescent agent, and the modifying agent reduces or prevents curing of the other portion of the sinterable material in proximity of the modifying agent.

3. The 3D printing method as defined in claim 2 wherein the quantity of excess energy is increased to account for secondary migration of energy to the other portion of the sinterable material.

4. The 3D printing method as defined in claim 2, further comprising determining an adjusted amount of the coalescent agent to apply within an edge boundary of the portion or within the portion to compensate for energy loss.

5. A three-dimensional (3D) printing method, comprising:
applying a sinterable material;
heating the sinterable material to a temperature ranging from about 50° C. to about 350° C.;
selectively applying a coalescent agent on a portion of the sinterable material;
determining how to selectively apply a modifying agent on an other portion of the sinterable material using a thermal diffusion characteristic of i) the sinterable material, ii) a layer to be formed of the portion sinterable material, or iii) both i and ii, the modifying agent including:
from about 70 wt % to about 95 wt % water;
from about 5 wt % up to 30 wt % of a co-solvent having a lower thermal diffusivity than water;
a surfactant; and
optionally a biocide;
wherein the determining involves empirically determining a quantity of the modifying agent and a temperature change effected by the quantity of the modifying agent; and
wherein the empirically determining involves:
exposing the sinterable material, without any coalescent agent or modifying agent thereon, to the radiation to form a reference area;
measuring a temperature of the reference area;
exposing the sinterable material, with the quantity of the modifying agent thereon, to the radiation to form a test area;
measuring the temperature of the test area;
determining a difference in temperature between the test area and the reference area; and
associating the quantity of the modifying agent with the difference in temperature
selectively applying the amount of the modifying agent on another portion of the sinterable material; and
exposing the sinterable material to radiation, whereby the coalescent agent at least partially cures the portion of the sinterable material in proximity of the coalescent agent, and the modifying agent reduces or prevents curing of the other portion of the sinterable material in proximity of the modifying agent.

6. The 3D printing method as defined in claim 1 wherein the sinterable material is applied on a contact surface, and wherein the method further comprises:

selectively applying the coalescent agent on the portion of the sinterable material in a pattern of a cross-section of a layer of a three-dimensional object to be formed, the cross-section being parallel to the contact surface; and selectively applying the modifying agent on the other portion of the sinterable material at an edge boundary of at least part of the cross-section.

7. A method for identifying how to apply a modifying agent during a three-dimensional (3D) printing method, the method comprising:

receiving, by a computer running computer readable instructions stored on a non-transitory, tangible computer readable storage medium, 3D shape information about a layer to be formed of a portion of a sinterable material, the 3D shape information including a value indicative of the selective application of a coalescent agent;

generating, by the computer, an energy or temperature profile for the layer to be formed of the portion of the sinterable material; and from the 3D shape information and the energy or temperature profile, identifying areas of the layer where an evaporative cooling effect of the modifying agent is to take place, the areas of the layer including a first area, where a degree of coalescence of the sintering material is to be reduced but coalescence still occurs;

based on the identification, generating, by the computer, a pattern for selective application of the modifying agent with respect to the layer to be formed;

wherein the modifying agent includes a surfactant, a co-solvent, water, and optionally a biocide.

8. The method as defined in claim 7, further comprising generating, by the computer, a modification value for adjusting the value indicative of the selective application of the coalescent agent.

9. A computational modeling method for identifying how to apply a modifying agent during a three-dimensional (3D) printing method, the computational modeling method comprising:

creating, by a computer running computer readable instructions stored on a non-transitory, tangible computer readable storage medium, a thermal diffusion model of a layer of a three-dimensional object to be formed from a portion of a sinterable material using the 3D printing method; and calculating, by the computer, a quantity of the modifying agent to be selectively applied at least some of the sinterable material to provide an evaporative cooling effect based upon the thermal diffusion model;

wherein:
the modifying agent includes a surfactant, a co-solvent, water, and optionally a biocide;
the thermal diffusion model identifies an excess energy outside an edge boundary of the layer; and
the calculating converts the excess energy to the quantity of the modifying agent to be selectively applied.

10. The computational modeling method as defined in claim 9, further comprising determining an amount of a coalescent agent to apply within an edge boundary of the portion or within the portion.

11. The method as defined in claim 7, further comprising selectively applying the modifying agent according to the pattern during the 3D printing method, wherein the modifying agent includes:
up to about 1.5 wt % of the surfactant;
from about 5 wt % to about 30 wt % of the co-solvent;
a balance of the water; and
optionally from about 0.01 wt % to about 0.2 wt % of the biocide.

12. The method as defined in claim 7 wherein the areas of the layer further include a second area, where coalescence of the sintering material is to be prevented.

13. The method as defined in claim 9 wherein the evaporative cooling effect prevents curing of the sinterable material, and wherein the modifying agent is to be selectively applied on the sinterable material without a coalescent agent.

14. The method as defined in claim 9 wherein the evaporative cooling effect prevents the sinterable material from becoming too hot and still enables curing, and wherein the modifying agent is to be selectively applied on the sinterable material with a coalescent agent.

15. The method as defined in claim 9, further comprising selectively applying the quantity of the modifying agent during the 3D printing method, wherein the modifying agent includes:
up to about 1.5 wt % of the surfactant;
from about 5 wt % to about 30 wt % of the co-solvent;
a balance of the water; and
optionally from about 0.01 wt % to about 0.2 wt % of the biocide.

* * * * *

UNITED STATES PATENT AND TRADEMARK OFFICE
CERTIFICATE OF CORRECTION

PATENT NO. : 10,471,698 B2
APPLICATION NO. : 15/127739
DATED : November 12, 2019
INVENTOR(S) : Keshava A. Prasad et al.

It is certified that error appears in the above-identified patent and that said Letters Patent is hereby corrected as shown below:

In the Claims

In Column 23, Line 42, Claim 2, delete "another" and insert -- an other --, therefor.

In Column 24, Line 7, Claim 2, delete "another" and insert -- an other --, therefor.

In Column 24, Line 58, Claim 5, delete "another" and insert -- an other --, therefor.

Signed and Sealed this
Thirty-first Day of March, 2020

Andrei Iancu
*Director of the United States Patent and Trademark Office*